(12) United States Patent
Oohara et al.

(10) Patent No.: US 7,799,588 B2
(45) Date of Patent: Sep. 21, 2010

(54) METHOD OF MANUFACTURING THE OPTICAL DEVICE BY A STOPPER TO FORM AN OXIDE BLOCK

(75) Inventors: Junji Oohara, Nisshin (JP); Hisaya Katoh, Takahama (JP); Toshiyuki Morishita, Nagoya (JP); Yukihiro Takeuchi, Nishikamo-gun (JP)

(73) Assignee: DENSO CORPORATION, Kariya (JP)

( * ) Notice: Subject to any disclaimer, the term of this patent is extended or adjusted under 35 U.S.C. 154(b) by 748 days.

(21) Appl. No.: 11/783,434

(22) Filed: Apr. 10, 2007

(65) Prior Publication Data

US 2007/0251915 A1    Nov. 1, 2007

(30) Foreign Application Priority Data

Apr. 13, 2006   (JP) .............................. 2006-111183
Oct. 27, 2006   (JP) .............................. 2006-293032

(51) Int. Cl.
    *H01L 21/00*   (2006.01)

(52) U.S. Cl. .............................. 438/31; 438/7; 438/27; 438/32; 438/424; 257/98; 257/446; 257/466; 257/E31.127; 250/216; 250/239; 385/88; 385/129; 385/133

(58) Field of Classification Search ............... 438/7, 438/22, 27, 31, 32, 424; 257/98, 446, 466; 257/E31.127; 250/216, 239; 385/88, 129, 385/133
See application file for complete search history.

(56) References Cited

U.S. PATENT DOCUMENTS

| 6,630,389 | B2 | 10/2003 | Shibata et al. | |
|---|---|---|---|---|
| 2003/0031435 | A1* | 2/2003 | Yeh et al. | ..................... 385/120 |
| 2004/0173862 | A1 | 9/2004 | Oohara et al. | |
| 2005/0285216 | A1* | 12/2005 | Steinberg et al. | ............ 257/446 |

* cited by examiner

*Primary Examiner*—Thanh V Pham
(74) *Attorney, Agent, or Firm*—Posz Law Group, PLC

(57) ABSTRACT

A method of manufacturing an optical device includes: a first step of forming an optical-device forming body that includes a plurality of columnar structures arranged in an arrangement direction on a substrate surface via a trench and an outline structure connected to and containing therein the plurality of columnar structures; a second step of oxidizing the optical-device forming body from a state where the optical-device forming body starts to be oxidized to a state where the columnar structure is oxidized; and a third step in which an unoxidized residual part of the outline structure in the second step is oxidized after the second step so as to form an oxidized body. Furthermore, the third step includes restraining the outline structure from being deformed with respect to at least the arrangement direction of the columnar structures in the third step.

42 Claims, 26 Drawing Sheets

METHOD OF MANUFACTURING THE OPTICAL DEVICE BY A STOPPER TO FORM AN OXIDE BLOCK

CROSS REFERENCE TO RELATED APPLICATION

This application is based on Japanese Patent Applications No. 2006-111183 filed on Apr. 13, 2006, and No. 2006-293032 filed on Oct. 27, 2006, the contents of which are incorporated herein by reference in its entirety.

FIELD OF THE INVENTION

The present invention relates to an optical device and a method of manufacturing the same.

BACKGROUND OF THE INVENTION

JP-A-2004-271756 (corresponding to US 2004/0173862 A1) describes a technique for integrating optical devices, such as a microlens or a microprism, made of $SiO_2$ on a Si substrate.

In JP-A-2004-271756, in order to form an optical device, a Si substrate 201 is provided with both masks 207 for digging the outline of the optical device in the Si substrate 201 and for digging a plurality of trenches 208 for filling the inside of the optical device with $SiO_2$, as shown in FIGS. 40A to 40C. Etching is performed to the Si substrate 201 with the masks 207 provided thereon to form columnar Si structures 203 having the outline in the same shape as that of the outline of the optical device and including the plurality of trenches 208.

Furthermore, in the states shown in FIGS. 40A to 40C, thermal oxidation treatment is applied to the columnar Si structures 203, thereby filling the trenches 208 with the $SiO_2$ expanded by the thermal oxidation. The relationship between the width of the columnar Si structure 203 sandwiched between the adjacent trenches 208, and the width of the trench 208 is set such that the trench 208 is filled when the columnar Si structures 203 are thermally oxidized to the $SiO_2$ structure.

However, the edge of the substrate 201 cannot be accurately formed by etching. For example, the corner of the trench 208 is formed in a smooth corner shape as shown in FIG. 41A. In the columnar Si structure 203 sandwiched between the two trenches 208, the position of a Si atom located at the same distance from both the trenches 208 is indicated by a point "a", and the point of intersection between a Si structure forming the outline and the columnar Si structure 203 is indicated by a point "b". When Ra is the shortest distance between the point "a" and the trench 208, and Rb is the shortest distance between the point "b" and the trench 208, the following relation is obtained: Ra<Rb. The shortest distance to the trench 208 depends on the point in the Si structure 203. The longer the distance of the Si atom to the trench 208, the more the time needed for the oxidation. Thus, when the Si atom at the point "a" is completely oxidized, the Si atom at the point "b" is not oxidized yet as shown in FIG. 41B. For this reason, in order to oxidize the Si atom at the point "b", a part of the trench 208 needs to remain as some clearance for passage of oxygen molecules for oxidizing the Si atom at the point "b" at the time of the completion of oxidation of the Si atom at the point "a". Moreover, this clearance will never be filled completely after the Si atom at the point "a" is oxidized, as shown in FIG. 41C. Conversely, the clearance extends in the arrangement direction of the columnar Si structures by the oxidation of the Si atom at the point "b". For example, the Si atom located at the point "a" moves to a point "a'", and the Si atom located at the point "b" moves to a point "b'". In use of the optical device, the presence of the large clearance inside the device causes the transmitted input light to be refracted in an undesired direction, which does not emit the sufficient transmitted light. Accordingly, light transmission property of the optical device is reduced.

SUMMARY OF THE INVENTION

In view of the foregoing problems, it is an object of the invention to provide an optical device and a method of manufacturing an optical device, which can restrain expansion of clearance in an arrangement direction of columnar structures when oxidizing a Si atom located near a point of intersection between a Si structure part forming at least the outline of the optical device and the columnar structure.

It is another object of the present invention to provide an optical device and a method of manufacturing thereof, which can effectively improve light transmission property.

According to an aspect of the present invention, a method of manufacturing an optical device that is made of silicon oxide includes: a first step of forming, on a substrate surface of a silicon substrate, an optical-device forming body that includes a plurality of columnar structures arranged in an arrangement direction on the substrate surface via a trench provided therebetween and an outline structure connected to and containing therein the plurality of columnar structures; a second step of oxidizing the optical-device forming body from a state where the optical-device forming body starts to be oxidized to a state where the columnar structure is oxidized; and a third step in which an unoxidized residual part of the outline structure in the second step is oxidized after the second step, so as to form an oxide block. Furthermore, the third step includes restraining the outline structure from being deformed with respect to at least the arrangement direction of the columnar structures in the third step.

Accordingly, in the first step, the silicon substrate is subjected to etching to form the optical-device forming body which includes the columnar structures and the outline structure. In the second step, the oxidation of the optical-device forming body is started to oxidize at least the columnar structures. In this second step, the outline structure cannot be oxidized completely, so that a part near a connection point of the outline structure with the columnar structure remains unoxidized (as an unoxidized residue). In the third step, the unoxidized residue is oxidized, while restraining the expansion of the outline structure in the arrangement direction of the trenches, which may occur in oxidation of the unoxidized residue. As a result, it can prevent the trenches from extending in the third step as compared with that at the end of the second step.

For example, the restraining may be performed by a stopper, and the stopper may be a part of the silicon substrate integrally formed on a side end surface in the arrangement direction of the columnar structures of the optical-device forming body. The stopper may be brought into contact with a surface of the oxidized part other than an incident surface and an emission surface of an incident light of the oxide block, or the stopper may have a convex shape or a concave shape with respect to a direction perpendicular to the arrangement direction of the columnar structures.

The trench may be not filled completely to cause a void to remain at the time of the completion of the third step, and the void may be filled in a coating process of a silicon oxide film. Alternatively, the oxide block may have impurities added thereto so as to have a concentration distribution in a direction perpendicular to the arrangement direction and an extending direction of the columnar structure. For example, the impurity includes at least one of germanium (Ge), phosphorus (P), stannum (Sn), and boron (B). Furthermore, a width of the trench and a width of the columnar structure in the first step may be set such that the trench is filled with the silicon oxide while the outline structure becomes the silicon oxide in a thermal oxidation of the third step.

In the method, the first step may include a step of forming the trench by reactive ion etching, a step of forming an oxide film for protection on an inner wall of the trench, a step of etching the oxide film for protection on a bottom of the trench, and then further deepening the trench from the bottom by the reactive ion etching, thereby to form the trench having an aspect ratio of one or more.

According to another aspect of the present invention, a method of manufacturing an optical device, includes: a first step of performing trench etching in a silicon substrate using a patterned mask and forming a plurality of columnar structures such that the columnar structures are arranged in an arrangement direction via a first trench; a second step of replacing the entire columnar structures with silicon oxide by thermal oxidation; and a third step of pressing the plurality of columnar structures in the arrangement direction after the second step under a condition in which the silicon oxides are fusion bonded. The first trench and the columnar structures are formed in the first step such that a void derived from the first trench remains between the adjacent columnar structures at a time of completion of the second step. Furthermore, in the third step, the adjacent columnar structures are brought into contact with each other by being pressed in the arrangement direction, and the plurality of columnar structures are connected by fusion and integrated to form a silicon oxide block through which light passes. Accordingly, it is possible to uniformly form the silicon oxide in the optical device while preventing an unoxidized silicon in the optical device. As a result, light transmission property of the optical device can be effectively improved.

For example, in the first step, a columnar pressing structure may be formed outside of at least one of two ends in the arrangement direction of the plurality of columnar structures by the trench etching. In this case, the pressing structure may have an unoxidized residual area at the time of the completion of the second step. Furthermore, in the third step, the plurality of columnar structures may be pressed by the pressing structure by oxidizing at least a part of the unoxidized area to form the silicon oxide block in a thermal oxidation condition set as a condition of fusion of the silicon oxide. For example, the pressing structure may be formed via a second trench with respect to the end of the columnar structure in the first step. Alternatively, the columnar structures may be selectively and thermally oxidized without thermally oxidizing the pressing structure, and the pressing structure may be thermally oxidized.

Furthermore, the pressing structure may be an area which is replaced with the silicon oxide and the unoxidized area at the time of the completion of the second step, and the second trench and the pressing structure may be formed in the first step such that a void derived from the second trench remains. Alternatively, the second trench and the pressing structure may be formed in the first step such that the void derived from the second trench remains at the time of the completion of the third step. Furthermore, the second trench and the pressing structure may be formed in the first step such that the plurality of voids remain and are distributed at the time of the completion of the third step. Alternatively, the pressing structure may be formed in the first step to be connected with the columnar structure, or the pressing structure may be formed in the first step to be independent from the columnar structures.

Alternatively, the pressing structure may be formed with respect to one end of the plurality of columnar structures in the arrangement direction, and a first expansion restraining structure may be formed by the trench etching so as to be adjacent to the other end of the plurality of columnar structures in the arrangement direction. In this case, the first expansion restraining structure has a silicon width in the arrangement direction that is wider than that of the columnar structure and that of the pressing structure, and is adapted for restraining deformation of the columnar structure toward an opposite side to the pressing structure in the arrangement direction. Alternatively, a second expansion restraining structure may be formed by the trench etching in the first step so as to sandwich the pressing structure between the second expansion restraining structure and the end of the plurality of columnar structures in the arrangement direction. In this case, the second expansion restraining structure has a silicon width in the arrangement direction that is wider than that of the pressing structure, and is adapted for restraining deformation of the pressing structure toward an opposite side to the columnar structure in the arrangement direction.

According to another aspect of the present invention, an optical device includes a silicon substrate, and a silicon oxide block formed by integrating a plurality of columnar structures by fusion. The columnar structures are made of silicon oxide and arranged in an arrangement direction on an upper surface of the silicon substrate, so as to allow light to pass through the silicon oxide block. Furthermore, the silicon oxide block has a width of an interface with the silicon substrate in the arrangement direction, that is wider than that of an upper part of the silicon oxide block with respect to the interface. Accordingly, it is possible to uniformly form the silicon oxide in the optical device while preventing an unoxidized silicon in the optical device. As a result, light transmission property of the optical device can be effectively improved.

For example, a columnar pressing structure may be made of silicon oxide, or silicon oxide and silicon, and may be disposed on the upper surface of the silicon substrate so as to be adjacent to at least one end of the plurality of columnar structures in the arrangement direction. In this case, the pressing structure is connected to a part of the end of the columnar structure by fusion, and has a width of the part in contact with the columnar structure, that is wider than that of the columnar structure in the arrangement direction.

BRIEF DESCRIPTION OF THE DRAWINGS

Additional objects and advantages of the present invention will be more readily apparent from the following detailed description of preferred embodiments when taken together with the accompanying drawings. In which:

FIGS. 3A and 3B are sectional view and plan view, respectively, showing an oxide mask layered on a silicon substrate, in which FIG. 3A is a cross-sectional view taken along the line IIIA-IIIA in FIG. 3B;

FIGS. 4A and 4B are sectional view and plan view, respectively, showing a state after a part of the oxide mask formed on the silicon substrate is removed, in which FIG. 4A is a cross-sectional view taken along the line IVA-IVA in FIG. 4B;

FIGS. 6A and 6B are sectional views showing a state after the oxide mask is removed, in which FIG. 6B is a cross-sectional view taken along the line VIB-VIB in FIG. 6A;

FIGS. 7A and 7B are sectional views showing columnar structures completely oxidized, in which FIG. 7B is a cross-sectional view taken along the line VIIB-VIIB in FIG. 7A;

FIGS. 9A and 9B are sectional views showing a further oxidation state after the state of FIGS. 7A and 7B, in which FIG. 9A is a cross-sectional view taken along the line IXA-IXA in FIG. 9B, and FIG. 9B is a cross-sectional view taken along the line IXB-IXB in FIG. 9A;

DETAILED DESCRIPTION OF THE PREFERRED EMBODIMENTS

First Embodiment

A first embodiment, in which an optical device according to the invention is typically used for a prism, will be described below with reference to FIG. 1 to FIG. 9B.

Figure 1:
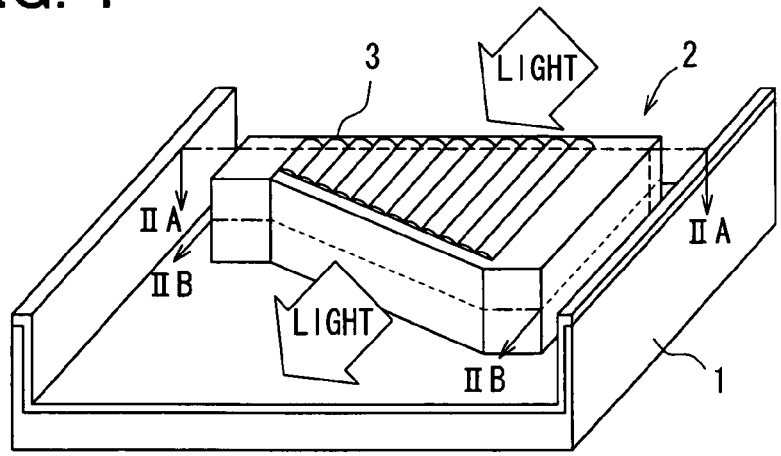
FIG. 1 is a perspective view showing an optical device (prism) according to a first embodiment of the present invention.

As shown in FIG. 1, the optical device is a prism 2 erecting (standing) on a silicon substrate 1. The prism 2 is integrally formed with a plurality of columnar structures 3 disposed adjacent to each other and made of silicon oxide on the upper side of the silicon substrate 1. Because the prism 2 is made of silicon oxide, incident light IN entering the silicon substrate 1 from the horizontal direction perpendicular to the upper direction in FIG. 1 and the arrangement direction (i.e., arrangement direction) of the columnar structures 3, is polarized by the prism 2. The polarized light is emitted from the surface of the prism 3 toward the lower direction in FIG. 1 of the prism 2, that is, from an emission surface opposed to an incident surface of the prism 2.

Figure 2A:
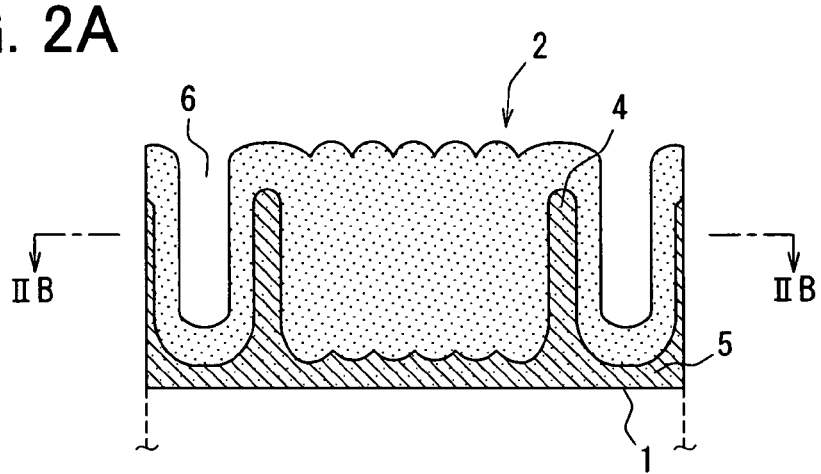
FIG. 2A is a cross-sectional view taken along the line IIA-IIA in FIG. 1.

As shown in FIG. 2A, each columnar structure 3 has an arc-shaped lower surface, and the plurality of columnar structures 3 are erected adjacent to each other to form a silicon oxide block (prism 2), which is connected to a fine concavo-convex interface with the silicon substrate 1 without an adhesive. That is, the silicon oxide block (prism 2) stands on the upper surface of the silicon substrate 1, while the lower surface of the silicon oxide block serving as the interface to the silicon substrate 1 is in a state of having a continuous concavo-convex shape that is parallel to the surface of the silicon substrate 1. This structure allows the light to pass through the silicon oxide block (prism 2) integrally formed with the silicon substrate 1.

Stoppers 4 exist integrally with both the silicon oxide block (prism 2) and the silicon substrate 1 at two end portions of the silicon oxide block (prism 2). The stopper 4 is a part of the silicon substrate 1 which remains unoxidized in a thermal oxidation process, which will be described later using FIGS. 6 to 9B. The stopper 4 has a square pillar shape that protrudes from the silicon substrate 1.

Figure 2B:
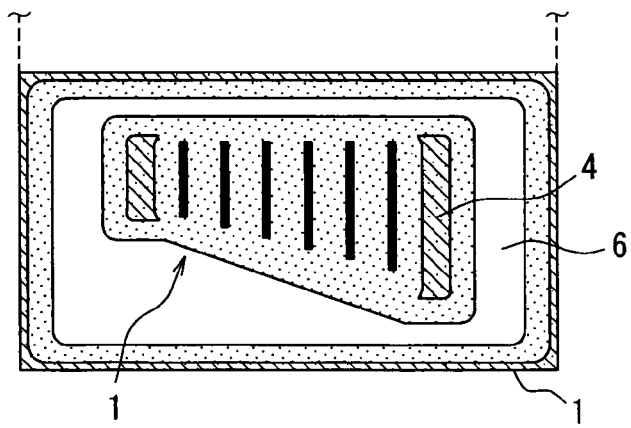
FIG. 2B is a cross-sectional view taken along the line IIB-IIB in FIG. 1 or in FIG. 2A.

The plurality of columnar structures 3 made of silicon oxide are provided to extend in parallel to an optical axis on the upper surface of the silicon substrate 1 as shown in FIGS. 2A and 2B. This renders the extending direction of the columnar structure 3 parallel to the direction of light transmittance, so that an angle to the light transmittance direction can be equal or less than the angle of total reflection between the silicon oxide and an air layer, thereby reducing decrease in light transmittance due to light scattering or the like. The silicon oxide block (prism 2) formed integrally with the silicon substrate 1 has on its lower side a connection portion 5 (pedestal portion) made of the silicon substrate 1 having the same shape as that of the silicon oxide block. Furthermore, the prism 2 integrally formed with the silicon substrate 1 is provided with a surrounding groove 6 existing around the prism 2. The prism 2 (silicon oxide block) is 10 µm or more, specifically, about 100 µm in thickness (height H) in the upper-lower direction (vertical direction). The width W of the prism 2 in the direction perpendicular to the optical axis is about 200 µm, the width W2 of a smaller side area of the prism 2 parallel to the optical axis is about 50 µm, and the width W2 of a wider side area thereof is about 100 µm, for example.

Figure 3A:
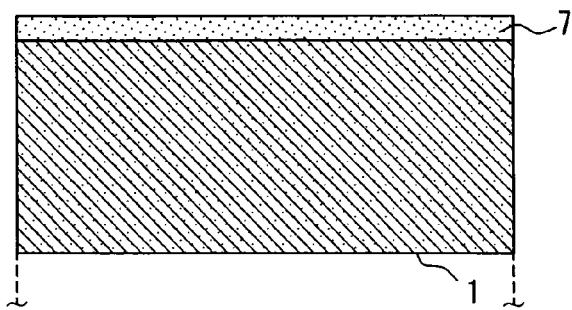
Figure 3B:
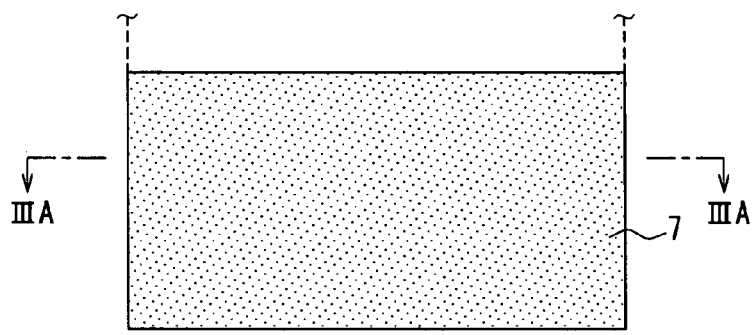

Next, a method of manufacturing the prism 2 in the first embodiment will be described using FIGS. 3A to 9B. FIG. 3A is a sectional view of the silicon substrate 1 (corresponding to FIG. 2A before manufacturing), and FIG. 3B is a plan view of the silicon substrate 1. As shown in FIGS. 3A and 3B, an oxide mask 7 is formed uniformly on the silicon substrate 1.

Figure 4A:
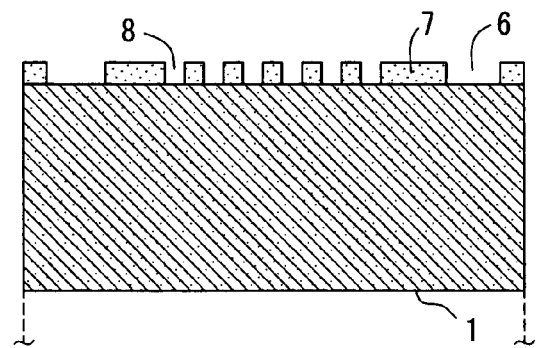
Figure 4B:
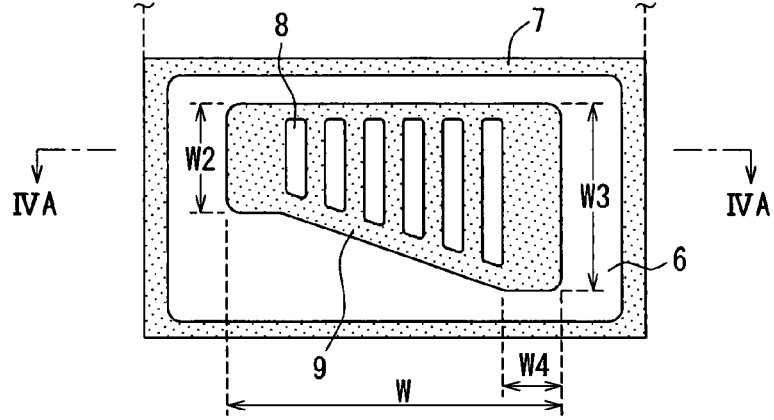

Then, as shown in FIGS. 4A and 4B, patterning of the outline shape of the prism 2 and of the plurality of trenches 8 is performed by removing parts of the oxide mask 7. FIG. 4A is a sectional view of the silicon substrate 1 (from the same viewpoint as that in FIG. 3A), and FIG. 4B is a plan view of the silicon substrate 1 (from the same viewpoint as that in FIG. 3B). Although it is desirable that the patterning accurately defines a square, the removed corner of the oxide mask 7 generally has a curved outline.

At this time, the thickness of the oxide film is set to be equal to or more than (extraction width+residual width). The formation of the thermal oxide film normally proceeds inside and outside of the silicon surface at a ratio of 0.45:0.55. In the first embodiment, the extraction width and the remaining width are set according to this ratio. The width of the trench 8 and the width of a silicon layer (columnar structure 3 to be described later) between the trenches 8 are set such that the silicon layer between the trenches 8 (columnar structure 3) becomes completely silicon oxide at a time when the inside of the trench 8 is substantially filled with the silicon oxide by the thermal oxidation. That is, the width of the trench 8 is determined such that some clearance remains at a time when the columnar structure 3 is completely oxidized.

On the other hand, as shown in FIG. 4B, in the patterning, the outline shape of the prism 2 (outline structure 9 to be described later) and the stopper 4 to be described later are also defined in addition to the silicon layer between the trenches (columnar structure 3). Note that the above-mentioned trench 8 is incorporated in the annular part inside the outline of the prism 2. The stoppers 4 are set at two end parts of the outline shape of the prism 2 in the arrangement direction of the trenches 8. The ratio of the width W4 of the stopper 4 in the optical axis direction of the prism 2 to the width W of the prism 2 in the same direction is about 5%. In other words, when the width W of the prism 2 is about 200 µm, the width W4 of the stopper 4 becomes about 10 µm.

Figure 5:
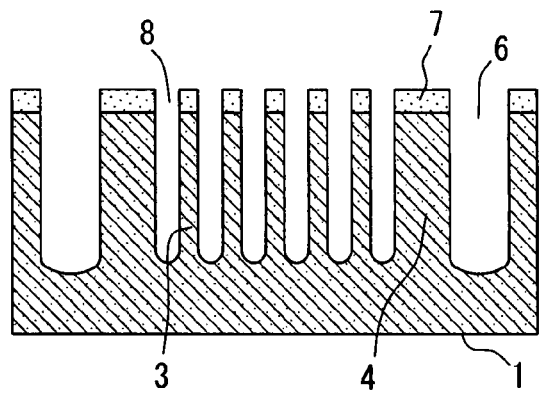
FIG. 5 is a cross-sectional view showing a state after etching is applied to the substrate of FIG. 4A.

As shown in FIG. 5, etching is applied to the substrate shown in FIG. 4A from openings of the oxide mask 7 so as to form the plurality of trenches 8 on and inside of the outline shape of the prism 2.

More specifically, in a first step (etching step), the silicon substrate 1 is trench etched using the mask patterned to arrange a number of trenches 8 side by side with a predetermined distance spaced apart from each other, while defining the outline of the prism 2 including the stoppers 4. Each trench has a certain width. In the following, a frame member constituting the outline shape of the prism 2 is referred to as the outline structure 9, and a member extended in the same direction in parallel to the optical axis inside the outline structure 9 is referred to as the columnar structure 3. The width of the opening in the oxide mask 7 and the distance between the openings therein are adjusted such that the ratio of the trench width (hereinafter referred to as "extraction") to the width of the silicon serving as a wall between the trenches (hereinafter referred to as a "residue") is 0.55:0.45. For example, for the extraction of 1.1 µm, the residue is 0.9 µm; while for the extraction of 2.2 µm, the residue is 1.8 µm.

Furthermore, the entire silicon substrate is subjected to anneal treatment in a hydrogen atmosphere to lessen the surface roughness of the trench side walls. The evenness of the trench side wall surface after the etching, and of a side wall surface defining the prism outline is important, because such surfaces become a light incident surface or a light emission surface. Thereafter, performing the thermal oxidation can provide a smooth lens surface. This technique is disclosed in JP-A-2002-231945.

Figure 6A:
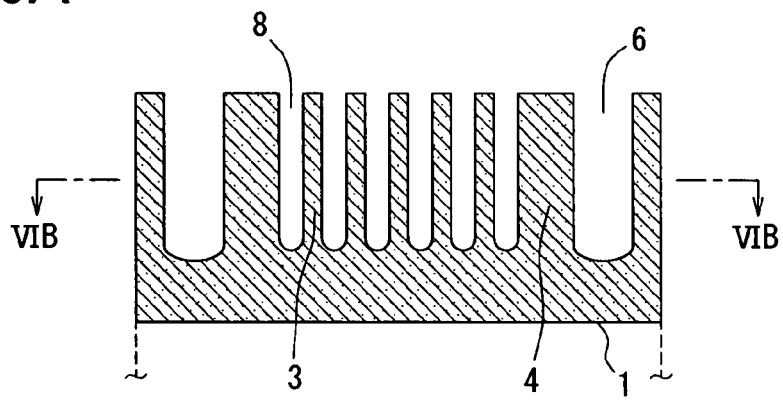
Figure 6B:
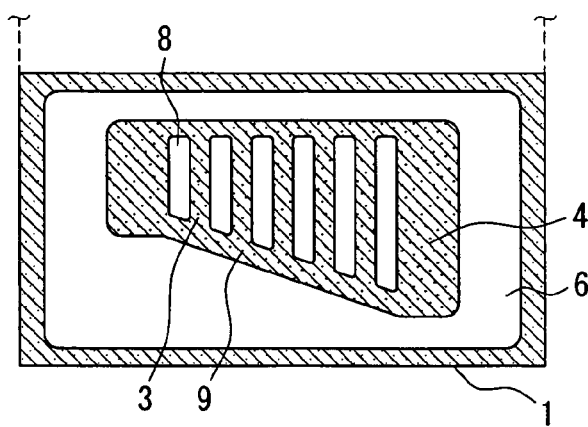

As shown in FIGS. 6A and 6B, the oxide mask 7 is removed by immersion in a hydrofluoric acid solution or the like. FIG. 6A is a sectional view of the silicon substrate 1 from the same viewpoint as that in FIG. 2A, and FIG. 6B is a sectional view of the silicon substrate 1 from the same viewpoint as that in FIG. 2B.

Reference will now be made to a thermal oxidation process using FIGS. 7A, 7B, 8, 9A and 9B. The thermal oxidation process involves filling the inside of the trenches with silicon oxide by thermal oxidation and replacing the outline structure 9 and the columnar structures 3 (silicon layers between the trenches 8) made of silicon by those made of silicon oxide, thereby forming the prism 2 (block for light transmittance) integrally with the silicon substrate 1. The thermal oxidation is performed at about 1100° C. at which the silicon oxide becomes to be low viscosity thereby to obtain the anneal effect.

Figure 7A:
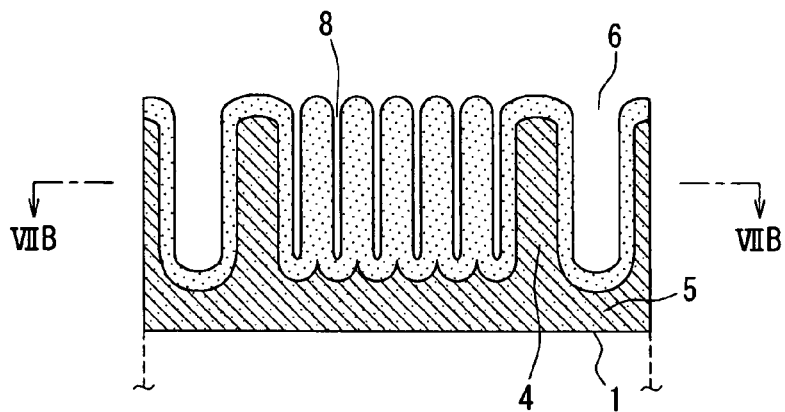
Figure 7B:
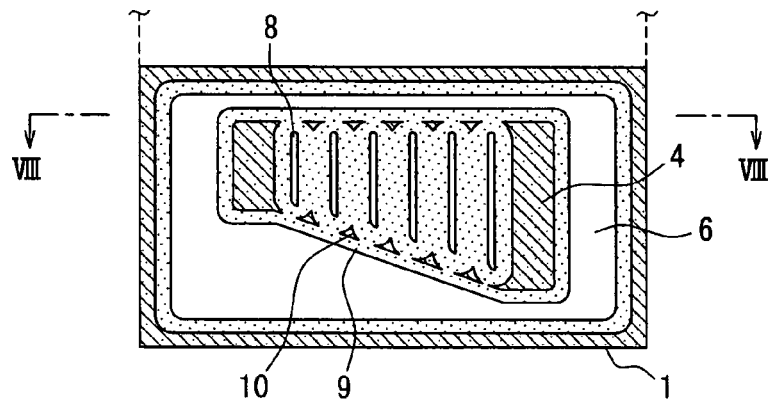
Figure 8:
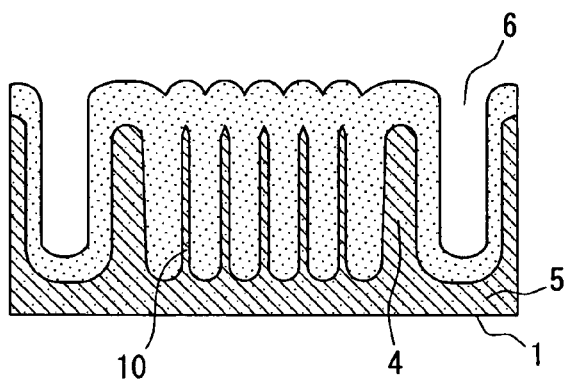
FIG. 8 is a cross-sectional view taken along the line VII-VII in FIG. 7B.

FIGS. 7A, 7B, and 8 are sectional views of the columnar structures 3 completely oxidized by the thermal oxidation. FIG. 7A is a sectional view of the silicon substrate 1 from the same viewpoint as that in FIG. 6A, and FIG. 7B is a sectional view of the silicon substrate 1 from the same viewpoint as that in FIG. 6B. FIG. 8 is a sectional view taken along the VIII-VIII of FIG. 7B.

At a time when the columnar structures 3 are completely oxidized as shown in FIG. 7A, a part of the outline structure 9 (near the point of intersection with the columnar structure 3) is not oxidized as shown in FIGS. 7B and 8. The unoxidized silicon near the point of intersection between the outline structure 9 and the columnar structures 3 is hereinafter referred to as an unoxidized residue 10.

Since the width of the trench 8 is set such that the inside of the trench 8 is not completely filled and some clearance remains at the time when the columnar structure 3 is completely oxidized, oxygen reaches the unoxidized residues 10 through the trenches 8 even after the complete oxidation of the columnar structures 3.

Figure 9A:
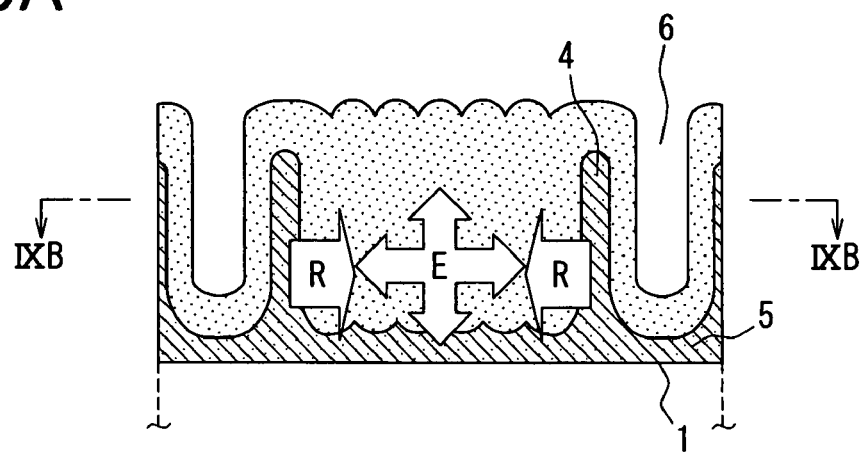
Figure 9B:
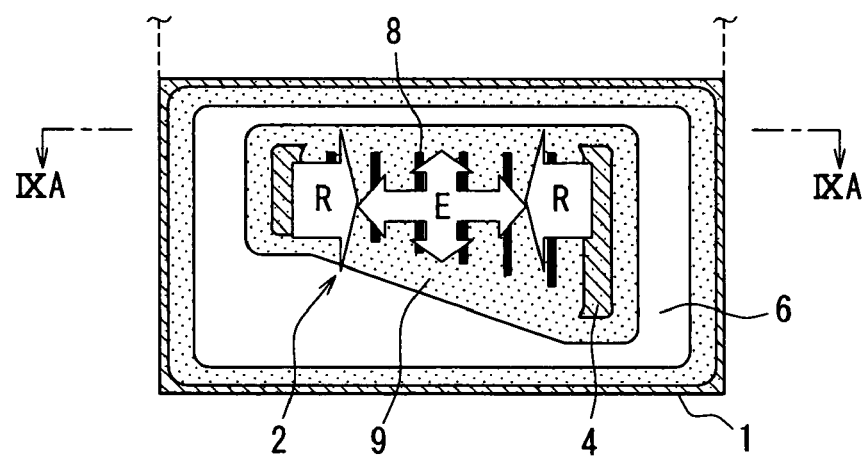

FIGS. 9A and 9B are sectional views of further oxidation states after the states shown in FIGS. 7A, 7B, and 8. FIG. 9A is a sectional view of the silicon substrate 1 from the same viewpoint as that in FIG. 7A, and FIG. 9B is a sectional view of the silicon substrate 1 from the same viewpoint as that in FIG. 7B.

Through FIGS. 7A to 9B, the unoxidized residue 10 is oxidized, causing an expansion force E in the plan direction of the silicon substrate 1 (including the arrangement direction of the columnar structures 3) inside the outline structure 9. However, as shown by R in FIGS. 9A and 9B, the expansion of the columnar structures 3 in the arrangement direction is restrained by the stoppers 4 remaining unoxidized.

This thermal oxidation is performed at high temperatures, for example, at 1100° C., allowing the silicon oxide to become to be low viscosity. The silicon oxide, the expansion of which is restrained by the stoppers 4, flows into the trench 8 remaining as the some clearance shown in FIGS. 7A and 7B. At the time when the silicon located near the point of intersection with the columnar structure 3 shown in FIGS. 7A and 7B is completely oxidized, the trenches 8 are filled in completely.

As mentioned above, since some trenches 8 are partly maintained upon the oxidation of the columnar structures 3, the silicon of the unoxidized residue 10 can be oxidized.

Moreover, when the silicon of the unoxidized residue 10 located near the point of intersection between the outline structure 9 forming the outline and the columnar structure 3 becomes the silicon oxide to expand its volume, the stopper 4 can prevent or restrain the expansion of the trenches 8 in the arrangement direction and the expansion of the outline of the prism 2 in the same direction.

Furthermore, in addition to provision of the stopper 4, the silicon is thermally oxidized at about 1100° C., thereby allowing the silicon oxide to become to be low viscosity. Since the stopper 4 reduces the expanding volume toward the arrangement direction of the trench 8, the fluid silicon oxide flows into some remaining trenches 8 for oxidizing the unoxidized residue 10. This can eliminate the step of filling some remaining trenches 8 after oxidization of the silicon of the unoxidized residues 10, or decrease the amount of filling the trenches. In a case where some trenches 8 remain after the unoxidized residues 10 are completely oxidized, a supercritical fluid can flow into these trenches 8 to fill the trenches 8.

Second Embodiment

A second embodiment will be described below with reference to FIG. 10A to FIG. 11D. The second embodiment differs from the above-mentioned first embodiment in that an illustrative optical device is a cylindrical lens 11. It is noted that, components equivalent to those described in the first embodiment described above are designated by the same reference numerals to omit the description of these components in the second embodiment.

Figure 10A:
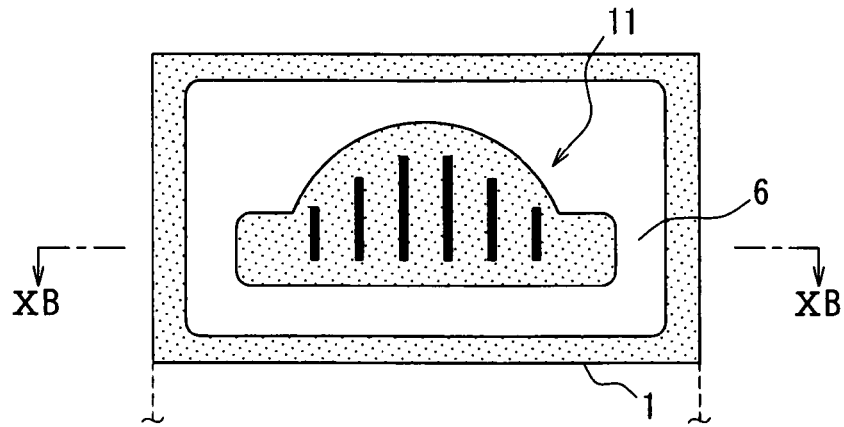
FIG. 10A is a schematic plan view showing a cylindrical lens.
Figure 10B:
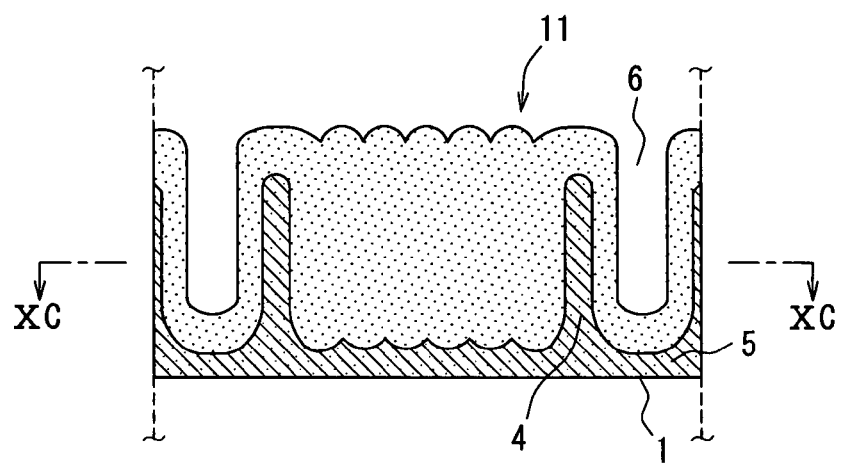
FIG. 10B is a cross-sectional view taken along the line XB-XB in FIG. 10A.
Figure 10C:
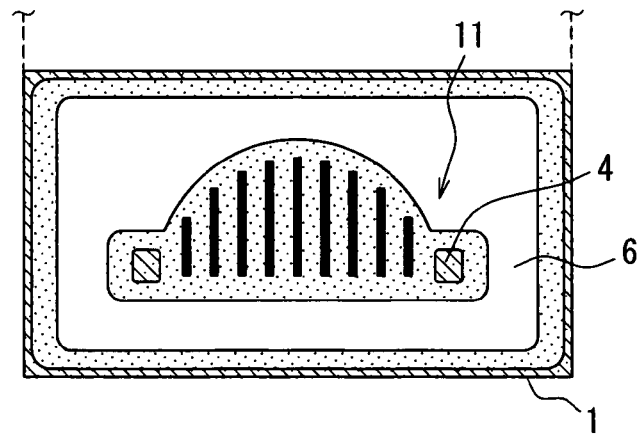
FIG. 10C is a cross-sectional view taken along the line XC-XC in FIG. 10B, according to a second embodiment of the present invention.

FIGS. 10A to 10C illustrate a piano-convex cylindrical lens 11, in which FIG. 10A is a plan view thereof, FIG. 10B is a cross-sectional view taken along the line XB-XB in FIG. 10A, and FIG. 10C is a cross-sectional view taken along the line XC-XC in FIG. 10B. As shown in FIGS. 10B and 10C, this cylindrical lens 11 has the stoppers 4 at its two end parts. These stoppers 4 can exhibit the same operation and effect as those in the first embodiment, while enabling the formation of the cylindrical lens 11.

Figure 11A:
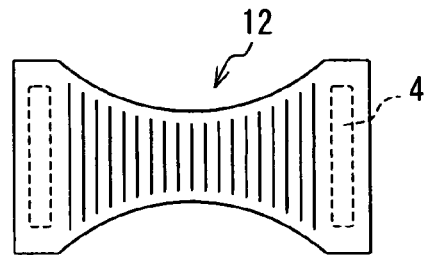
FIG. 11A is a plan view showing biconcave lens.
Figure 11B:
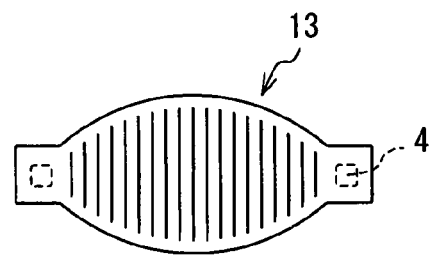
FIG. 11B is a plan view showing a biconvex lens.
Figure 11C:
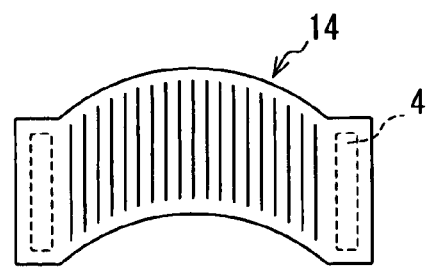
FIG. 11C is a plan view showing a meniscus lens.
Figure 11D:
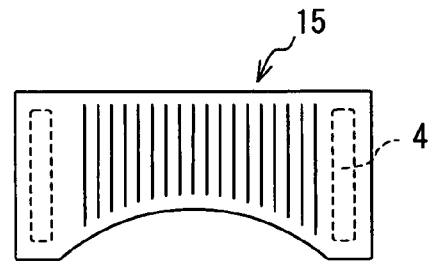
FIG. 11D is a plan view showing a plano-concave lens, according to the second embodiment.

Providing the stoppers 4 not only in the cylindrical lens 11, but also at both ends of the outline structure 9 of an optical device desired to be formed can form any optical device having any shape, such as a biconcave lens 12 as shown in FIG. 11A, a biconvex lens 13 as shown in FIG. 11B, a meniscus lens 14 as shown in FIG. 11C, a plano-concave lens 15 as shown in FIG. 11D, or the like. FIGS. 11A to 11D are plan views after the formation of the optical device, in which the stopper 4 is formed in an area enclosed by a dotted line.

Third Embodiment

A third embodiment will be described below using FIG. 12. The third embodiment differs from each of the above-mentioned embodiments in that an illustrative optical device is an optical device group of a plurality of optical devices. It is noted that, components equivalent to those described in the above-mentioned embodiments are designated by the same reference numerals to omit the description of these components in the third embodiment.

Figure 12:
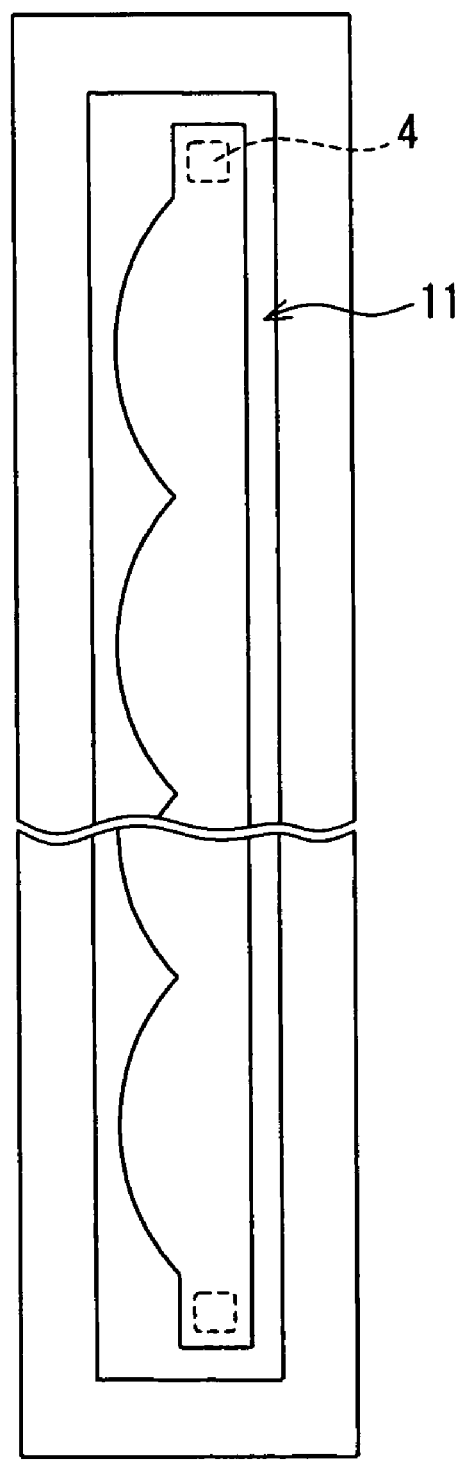
FIG. 12 is a plan view showing an optical device group according to a third embodiment of the present invention.

FIG. 12 is a plan view of the optical device group consisting of a plurality of cylindrical lenses 11. The optical device group has stoppers 4 formed at its both ends. That is, the stoppers 4 at both ends collectively restrain the expansion of the optical devices towards both ends, which may occur when the unoxidized residues 10 of the plurality of optical devices existing between the stoppers 4 are oxidized.

Thus, when the plurality of optical devices are formed adjacent to each other, the stoppers 4 can be provided at both ends of the optical device group and not at both ends of each optical device.

Furthermore, the plurality of optical devices are collectively patterned, subjected to the trench etching, and the thermal oxidation process, thereby collectively making these components in the substrate. In this case, even for a number of lens arrays or for a complicated optical system in which light passes through a plurality of lenses, the optical devices can be patterned and formed collectively in the substrate from one sheet of mask. Especially, in the latter case, a problem of alignment of optical axes of individual optical components, which would be a very complicated problem in a fine optical system, can be solved. The trench etching and the thermal oxidation process are performed using a mask for the formation of a plurality of optical components including at least one of a lens, an optical waveguide, and a slit in a broad sense. This can make the optical devices collectively in the silicon substrate 1, which does not need the alignment of the optical axes. In other words, when the structure of the optical device has a plurality of optical components including at least one of the lens, the optical waveguide, and the slit which are made in the silicon substrate 1, the alignment of the optical axes is not needed.

Fourth Embodiment

A fourth embodiment will be described below with reference to FIGS. 13 and 14. In the fourth embodiment, a wall surface 16 around an optical device is substituted for the stopper 4. It is noted that, components equivalent to those described in each of the above-mentioned embodiments are designated by the same reference numerals to omit the description of these components in the fourth embodiment.

Figure 13:
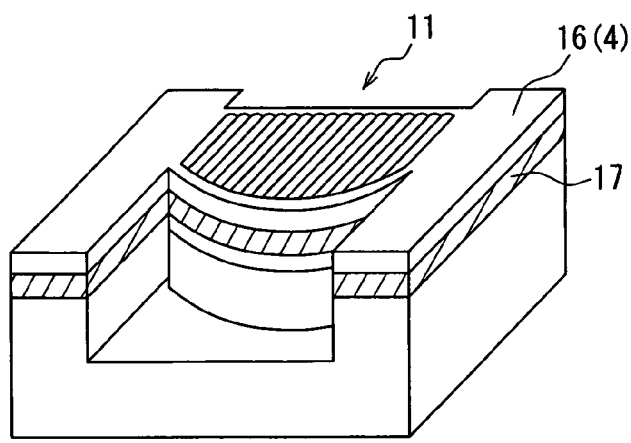
FIG. 13 is a perspective view showing an optical device according to a fourth embodiment of the present invention.
Figure 14:
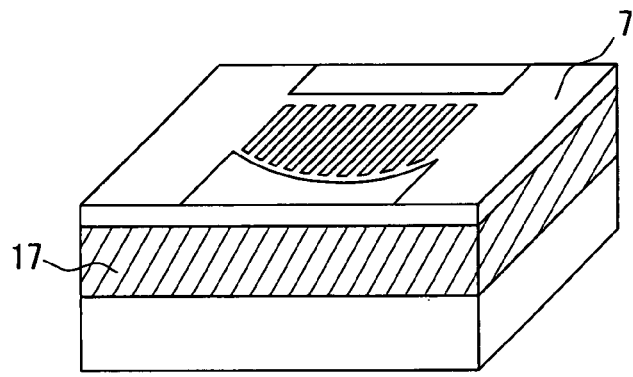
FIG. 14 is a perspective view showing a state having a layer of an oxide mask for forming the optical device according to the fourth embodiment.

FIG. 13 is a perspective view of an optical device in this embodiment. The optical device is a plano-concave type cylindrical lens 11, whose end surfaces other than a curved surface (emission surface) and a surface opposed to the curved surface (incident surface) are connected to the wall surface 16.

The silicon oxide block (lens) shown in FIG. 13 has impurities added thereto so as to have the concentration distribution of the impurities in the vertical direction (upper-down direction in FIG. 13). That is, an impurity addition layer 17 (e.g., epitaxial layer) is formed. One or more kinds of impurities, including germanium (Ge), phosphorus (P), stannum (Sn), boron (B), and the like, can be added.

A detailed description will be given below.

It is known that the formation of a thermal oxide film after doping the silicon substrate 1 with germanium (Ge), phosphorus (P), or stannum (Sn) as impurities increases a refractive index of the oxide film. Also, it is known that the thermal oxidation after doping the substrate with boron (B) changes the refractive index of the oxide film.

An epitaxial film whose impurity concentration of Ge is continuously changed is formed on the silicon substrate by CVD or the like. The concentration distribution in the thickness direction (in the depth direction) is formed in a mountain shape which has a peak at a predetermined depth. Then, as shown in FIG. 14, like the first embodiment, the outline of the optical device and a plurality of trenches 8 are defined using a mask, and DRIE and a thermal oxidation process are performed to form a lens shape. The long side of an opening of the trench 8 is parallel to the wall surface 16 (in the same direction as the light incident direction).

In this way, the trenches 8 are formed after growing on the substrate 1 the epitaxial film 17 whose impurity concentration is changed in the film thickness direction, which provides the concentration distribution of the impurities in the vertical direction in the block for light transmittance. The formation of the trenches 8 in the silicon substrate 1 whose impurity concentration is changed in the vertical direction gives the concentration distribution of the impurities in the light transmittance block in the vertical direction. Thus, the structure shown in FIG. 13 is obtained. In this case, since the refractive index distribution is provided in the depth direction of the substrate (in the height direction of the lens), a light-gathering function can be given not only in the in-plane substrate direction (in the horizontal direction) of the curved shape of the lens, but also in a direction perpendicular to the surface of the silicon substrate 1 (in the vertical direction).

The concentration distribution (change in concentration) of the epitaxial film 17 may be discontinuous. In this way, the epitaxial film is formed on the silicon substrate, which contains a heavier element than the silicon, specifically, Ge or P or Sn, as an impurity, and whose impurity concentration is changed continuously or discontinuously. Thus, after the formation of the epitaxial film (silicon layer) whose impurity concentration is changed continuously or discontinuously in the depth direction, the optical device (lens) is formed as described in the first embodiment. Alternatively, the epitaxial film is formed on the silicon substrate, which contains a lighter element than the silicon, for example, B, as an impurity, and whose impurity concentration is changed continuously or discontinuously. Thus, after the formation of the epitaxial film (silicon layer) whose impurity concentration is changed continuously or discontinuously in the depth direction, the optical device is formed as described in the first embodiment.

Also in the fourth embodiment, like the first embodiment, when the unoxidized residual area is oxidized in the thermal oxidation step, the outline of the optical device intends to expand toward the wall surface. However, since a part of the outline in the arrangement direction of the trenches 8 is in contact with the wall surface 16, the wall surface 16 restrains the expansion of the optical device, like the stopper 4 in the first embodiment.

In this way, the optical device in the fourth embodiment can perform the same operation and effect as that in the first embodiment, while substituting the wall surface 16 for the stopper 4.

Fifth Embodiment

A fifth embodiment will be described below with reference to FIG. 15. The fifth embodiment differs from the fourth embodiment in that an optical waveguide 18 in addition to an optical device (cylindrical lens 11) is integrally formed. It is noted that components equivalent to those described in the first embodiment described above are designated by the same reference numerals to omit the description of these components in the fifth embodiment.

Figure 15:
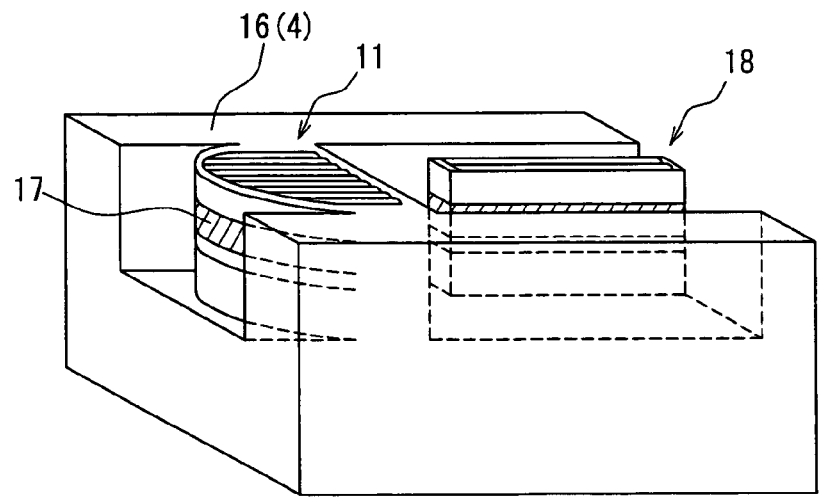
FIG. 15 is a perspective view showing a cylindrical lens and an optical waveguide according to a fifth embodiment of the present invention.

FIG. 15 is a perspective view of the cylindrical lens 11 and the optical waveguide 18 in the fifth embodiment. The cylindrical lens 11 has the same shape as the plano-convex type cylindrical lens 11 shown in FIG. 13 of the fourth embodiment, and end surfaces of the cylindrical lens 11 other than a curved surface and a surface opposed to the curved surface are connected to the wall surface 16. The optical waveguide 18 is provided to extend in parallel to two wall surfaces 16, and is erected integrally with the lens on the silicon substrate.

Forming steps of the cylindrical lens 11 and the optical waveguide 18 will be described below.

In the forming steps, like the fourth embodiment, after the epitaxial layer 17 is formed by changing the impurity concentration continuously or discontinuously, the cylindrical lens 11 is formed through the DRIE and the thermal oxidation process. In this embodiment, the optical waveguide 18 is also formed together with the cylindrical lens 11. The optical waveguide 18 can be formed in the same way as that of the cylindrical lens 11. In other words, when the number of trenches is small and an extremely long pattern is formed in the longitudinal direction in a periodic trench structure, a line-like silicon oxide ($SiO_2$) block, that is, the optical waveguide 18 can be formed. For example, two patterns of 1 mm in length in the longitudinal direction, which are disposed side by side and made of silicon layers having the residual width of 1.5 μm with the trench 8 of 1.5 mm in extraction width sandwiched therebetween, are subjected to the DRIE and the thermal oxidation process to form the optical waveguide 18 having the width of 6 μm and the length of 1 mm. The light is trapped in the vicinity of the center having the highest refractive index within the optical waveguide 18 by a difference in refractive index of the optical waveguide 18 in the vertical direction. Since an area around the optical waveguide 18 in the lateral direction is an open space, the light is trapped in the optical waveguide 18. This optical waveguide 18 can be formed in any shape depending on the pattern. Furthermore, the optical waveguide can be formed at the same time as that of the cylindrical lens 11, which does not need alignment of the waveguide in coupling with the cylindrical lens 11.

Sixth Embodiment

A sixth embodiment will be described below with reference to FIGS. 16A to 18. The sixth embodiment differs from each of the above-mentioned embodiments in that the stopper 4 has a complicated shape. It is noted that components equivalent to those described in each of the above-mentioned embodiments are designated by the same reference numerals to omit the description of these components in the sixth embodiment.

Figure 16A:
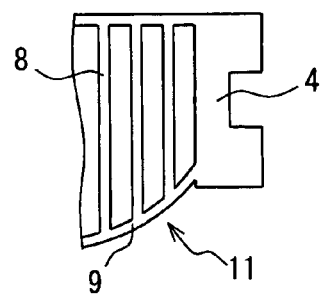
FIGS. 16A to 16D are plan views showing various stoppers according to a sixth embodiment of the present invention.
Figure 16B:
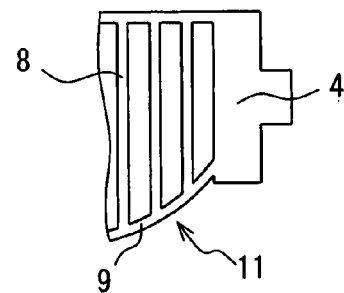

FIG. 16A to FIG. 16D respectively show plan views of the shapes of different stoppers 4 from that in each of the above-mentioned examples. As shown in FIG. 16A, the end surface of the outline structure 9 can be etched in a concave shape and oxidized to form the concave stopper 4. In contrast, as shown in FIG. 16B, the end surface of the outline structure 9 can be etched in a convex shape and oxidized to form the convex stopper 4.

Figure 16C:
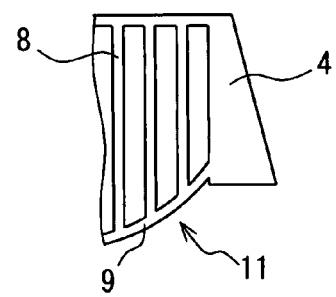

On the other hand, as shown in FIG. 16C, the end surface of the outline structure 9 is etched obliquely. This can be oxidized to form the stopper 4 in a triangle pole shape.

Figure 16D:
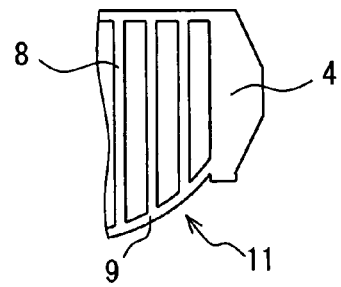

As shown in FIG. 16D, the end surface of the outline structure 9 is etched in a trapezoidal shape. This can be oxidized to form the stopper 4 in a trapezoidal pole shape.

As mentioned above, the stopper 4 can have any shape other than the cylindrical shape. For the concave stopper 4 shown in FIG. 16A, the area of the unoxidized residue 10 is large, and thus a part of the stopper 4 near the outline structure 9, which part tends to expand its volume drastically in the arrangement direction of the trenches 8, is set thicker.

Figure 17:
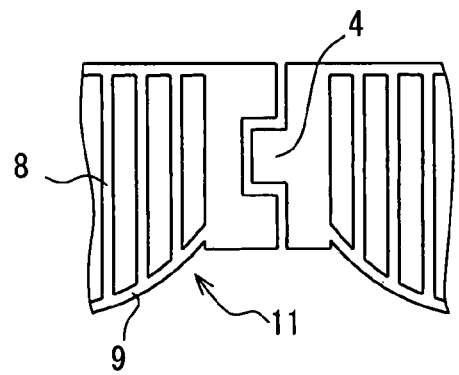
FIG. 17 is a plan view showing a state in which two different stoppers are combined according to the sixth embodiment.

The stopper 4 shown in FIG. 16B and the stopper 4 shown in FIG. 16A are combined as shown in FIG. 17, which can increase the stiffness of the stoppers in erecting the optical devices adjacent to each other, resulting in space savings.

Figure 18:
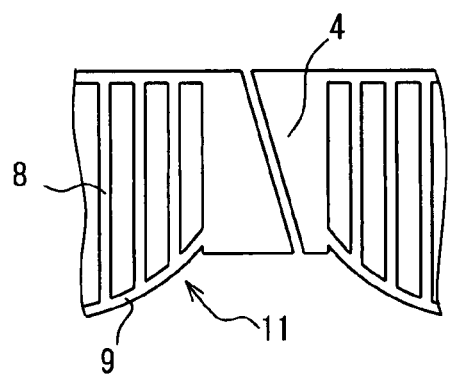
FIG. 18 is a plan view showing a state in which two triangle pole stoppers are combined according to the sixth embodiment.
Figure 19:
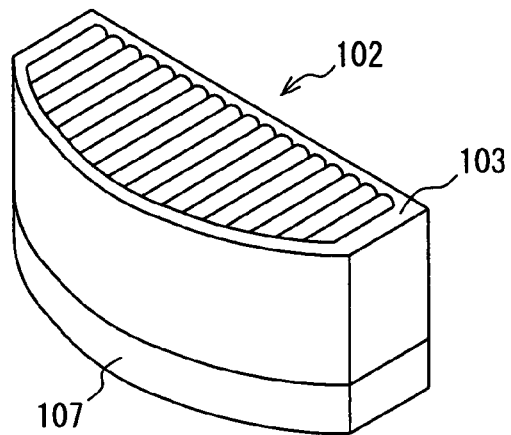
FIG. 19 is a perspective view showing a general shape of a lens according to an example of the present invention.

As shown in FIG. 16C, for the stopper 4 having the triangle pole shape, the triangle poles are alternately combined to each other, as shown in FIG. 18, which can increase the stiffness of the stoppers 4 in erecting the optical devices adjacent to each other, resulting in space savings.

As mentioned above, the shape of the stopper 4 may be any shape other than the square pole shape shown in the first embodiment, taking into consideration a space for erecting the optical device, the degree of expansion of the unoxidized residue 10 when oxidized, and the like.

Other Embodiments

In the first to sixth embodiments described above, the temperature at which the thermal oxidation is performed is set to about 1100° C. The reason why the temperature of the thermal oxidation is set to 1100° C. is that a typical oxidation furnace employs silica glass withstanding the temperature of about 1200° C. However, in use of the oxidation furnace withstanding the high temperatures of 1200° C. or more, the thermal oxidation may be performed at high temperatures at which the silicon oxide does not melt.

In the first to sixth embodiments as described above, at a time when the oxidation is terminated to complete the optical device, the stopper 4 remains. However, an object of providing the stopper 4 is to restrain the expansion of the outline structure 9 in the arrangement direction of the trenches 8 when the unoxidized residues 11 are oxidized. For this reason, even when the stopper 4 is removed at the time of the completion of the oxidation, the same operation and effect as that of each of the above-mentioned embodiments can be exhibited. Moreover, the width W4 of the stopper 4 may be determined such that the stopper 4 is completely oxidized at the time of the completion of the oxidation of the unoxidized residue 11. Alternatively, even after the completion of the oxidation of the unoxidized residue 11, the oxidation may be continued until the stopper 4 is completely oxidized.

In the first embodiment described above, the width W4 of the exemplary stopper 4 is set to about 10 µm. However, the width W4 is changed depending on the width of the outline structure 9 or the columnar structure 3 of interest to be oxidized, or on silicon material constituting these structures. Thus, the stopper 4 of the invention is not limited to the width W4 of the first embodiment, but may be any one that can restrain the expansion of the outline structure 9 when the unoxidized residue 11 is oxidized. As a result of experiments performed by the inventors of the present application, the expansion of the outline structure 9 can be effectively restrained when the width W4 of the stopper 4 is 5% or more of the width W of the optical device.

In each of the above-mentioned examples, the same material as that of the outline structure 9 or the columnar structure 3 is used to form the stopper 4. The stopper 4, however, does not always need to be made of the same material as that of the outline structure 9 or the columnar structure 3. For example, in the first embodiment, a metal member which is not modified by the thermal oxidation is sandwiched between the side end surface of the outline structure 9 not including the stopper 4 in the arrangement direction of the trenches 8 and the wall surface of the silicon substrate 1 (surrounding groove 6). In this case, in oxidation of the unoxidized residue 11, the metal member supported by the wall surface of the silicon substrate 1 can restrain the expansion of the outline structure 9 in the arrangement direction of the trenches 8, thereby exhibiting the same operation and effect as that in the first embodiment.

Although in each of the above-mentioned embodiments, the mask used for etching is an oxide mask, the mask used is not limited thereto. For example, the invention can also be implemented by using a resist mask instead of the oxide mask.

Seventh Embodiment

A seventh embodiment of the present invention will be now described with reference to FIGS. 19 to 27B.

As shown in FIGS. 20 to 23, an optical device 100 mainly includes a silicon substrate 101, a microlens 102 disposed on the upper surface of the silicon substrate 101, and a pressing structure 103 formed integrally with the end of the microlens 102 on the upper surface of the silicon substrate 101.

The silicon substrate 101 has a concave portion 104, and the microlens 102 is disposed on the inner bottom surface of the concave portion 104. In this embodiment, a plano-convex type cylindrical lens is employed as the microlens 102. The microlens 102 has a flat surface (incident surface 102a in the embodiment) and a convex surface (emission surface 102b in the embodiment).

Figure 22:
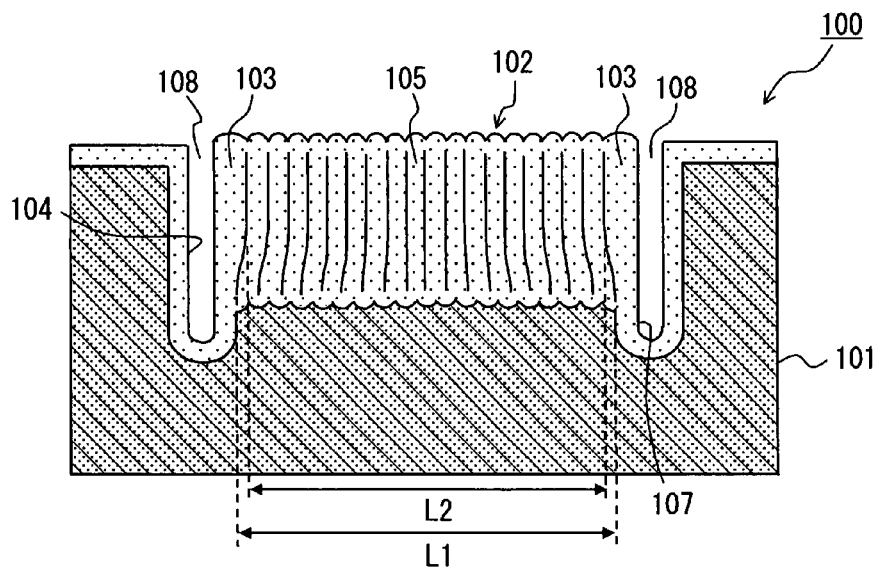
FIG. 22 is a cross-sectional view taken along the line XXII-XXII in FIG. 21.
Figure 23:
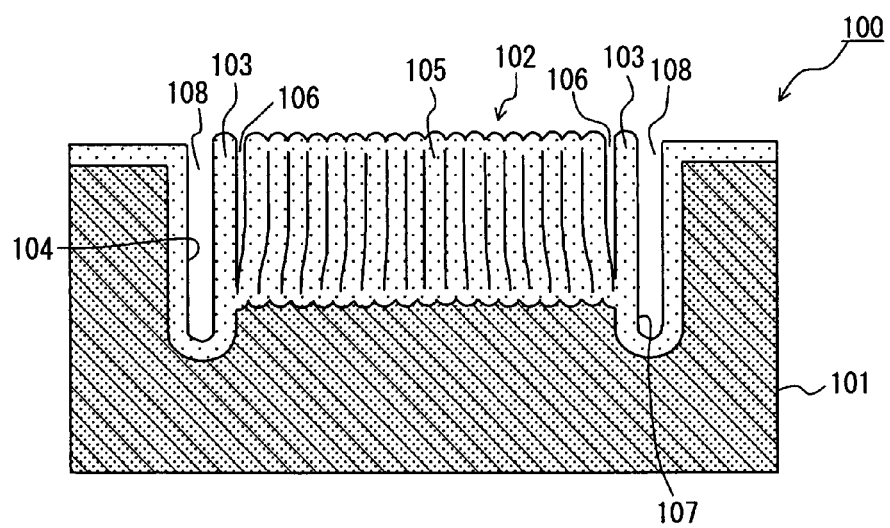
FIG. 23 is a cross-sectional view taken along the line XXIII-XXIII in FIG. 21.

The microlens 102 is a silicon oxide block consisting of a plurality of columnar structures 105 integrated into one piece by fusion, these structures being made of silicon oxide and disposed side by side on the upper surface of the silicon substrate 101, and is integrally formed with the silicon substrate 101. In detail, as shown in FIGS. 22 and 23, each columnar structure 105 has an arc-shaped lower surface, and the plurality of columnar structures 105 are erected adjacent to each other to form the silicon oxide block (microlens 102). The silicon oxide block is connected to a fine concavo-convex interface of the silicon substrate 101 without an adhesive. That is, the silicon oxide block (microlens 102) is erected from the upper surface of the silicon substrate 101, while the lower surface of the block serving as the interface to the silicon substrate 101 has a continuous concavo-convex shape continuing horizontally. This structure allows the light to pass through the silicon oxide block (microlens 102). Thus, the microlens 102 of the optical device 100 performs a substantially optical function. Additionally, the microlens 102 is connected to the silicon substrate 101 without any adhesive layer, which exhibits excellent discharge characteristic.

Figure 21:
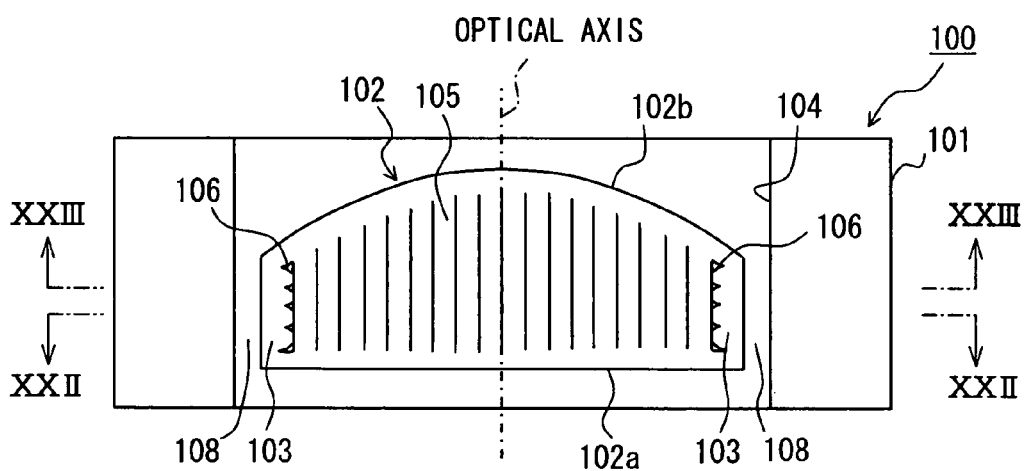
FIG. 21 is a schematic top view showing the optical device according to the seventh embodiment.

The plurality of columnar structures 105 are provided to extend on the upper surface of the silicon substrate 101 in parallel to the optical axis (as indicated by an alternate long and short dash line in FIG. 21) as shown in FIG. 21. Thus, an extending direction of the columnar structures 105 becomes parallel to the direction of light transmittance, so that an angle between an extending surface and the direction of light transmittance can be equal to or less than a critical angle between the silicon oxide and the air layer. This can reduce decrease in light transmittance due to light scattering or the like.

The microlens 102 consisting of a plurality of columnar structures 105, as shown in FIGS. 22 and 23, has a width of an interface portion with the silicon substrate 101 (L1 as indicated in FIG. 22) that is wider than a width of an upper portion of the microlens with the interface portion (L2 as shown in FIG. 22) in the juxtaposition direction (arrangement direction) of the columnar structure 105. Such a construction is provided by the effect of the pressing structure 103 in a manufacturing process, and a detail description thereof will be given below.

The pressing structure 103 is made of silicon oxide, or of silicon oxide and silicon. The pressing structures 103 are erected on the upper surface of the silicon substrate 101 so as to be adjacent to both ends of the microlens 102 in the juxtaposition direction of the columnar structures 105 (in the direction perpendicular to the optical axis). The pressing structure 103 is connected with a part of the end of the microlens 102 (columnar structure 105) by fusion. The width of the part of the pressing structure 103 in connection with the columnar structure 105 is wider than the width of the columnar structure 105 in the juxtaposition direction.

Figure 20:
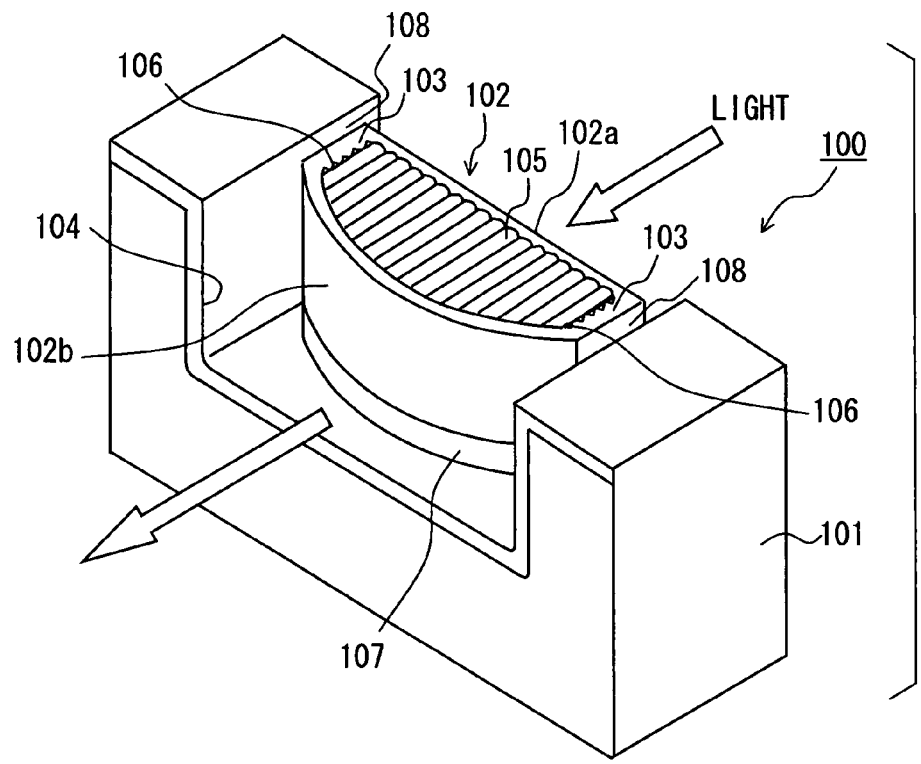
FIG. 20 is a perspective view showing an optical device according to a seventh embodiment of the present invention.

In the seventh embodiment, the pressing structure 103 is provided to be opposed to the entire end of the microlens 102 (columnar structure 105), and a void portion 106 is provided at a connection portion between the pressing structure 103 and the microlens 102. As shown in FIGS. 20, 21, and 23, the void portion 106 is a hole (air layer) that is opened at the upper surface of the connection portion. In the embodiment, a plurality of void portions 106 are distributed along the optical axis. Therefore, the pressing structure 103 has a part directly connected to the microlens 102 (fusion-bonded part) and a part connected to the microlens 102 via the void portion 106 (not directly connected part). As shown in FIG. 22, the width of the part directly connected to at least the microlens 102 is wider than the width of the separate columnar structures 105 in the juxtaposition direction, and the pressing structure 103 is in contact with a part of the end of the microlens 102 in the optical axis direction.

The microlens 102 and the pressing structure 103 as constructed above has on its lower side a pedestal portion 107 (a connection portion) that is made of the silicon substrate 101 and which has the same shape as that of the silicon oxide block. The microlens 102 and the pressing structure 103 integrally formed with the silicon substrate 101 are disposed in the concave portion 104, while being spaced apart from the inner side of the concave portion 104 with a surrounding groove 108 existing around them. This can separate the microlens 102 (and the pressing structure 103) from the silicon substrate 101 disposed outside thereby to avoid buckling in manufacturing. Note that the microlens 102 of the embodiment has a height of 10 μm or more, for example, about 100 μm. Furthermore, the microlens 102 including the pressing structure 103 has a width in the direction perpendicular to the optical axis of about 500 μm.

Figure 24:
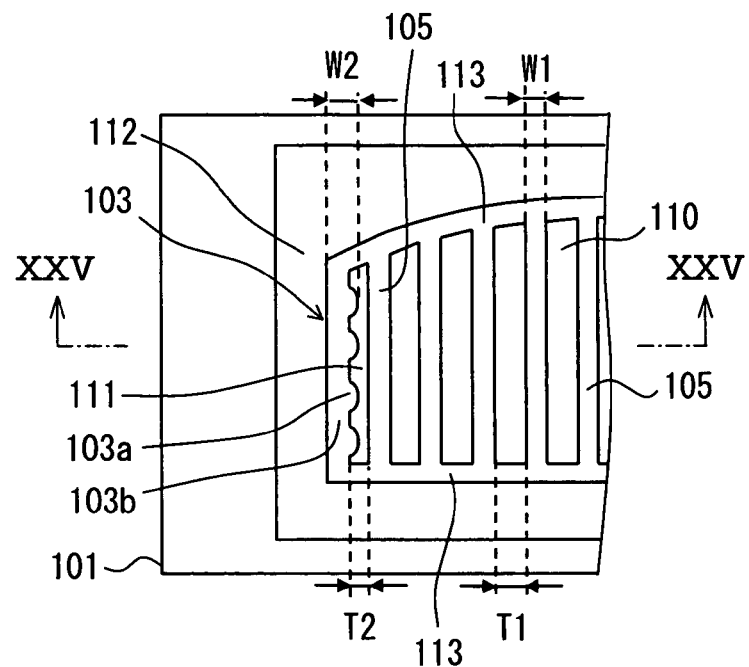
FIG. 24 is a schematic top view showing a part of the optical device in a trench etching step according to the seventh embodiment.
Figure 25:
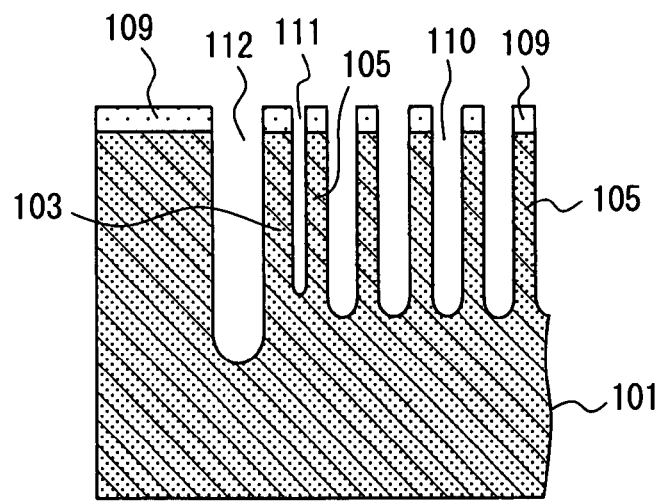
FIG. 25 is a cross-sectional view taken along the line XXV-XXV in FIG. 24.
Figure 26A:
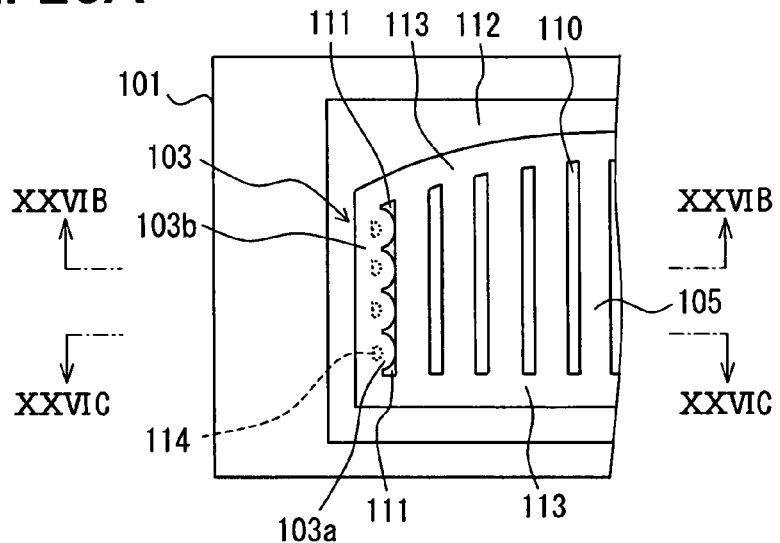
FIG. 26A is a schematic top view showing a part of the optical device in a thermal oxidation step according to the seventh embodiment.
Figure 26B:
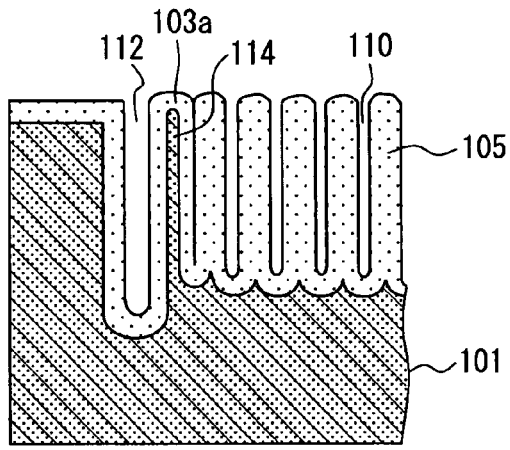
FIG. 26B is a cross-sectional view taken along the line XXVIB-XXVIB in FIG. 26A.
Figure 26C:
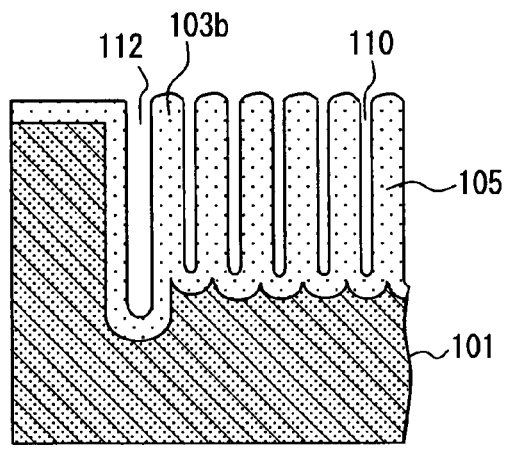
FIG. 26C is a cross-sectional view taken along the line XXVIC-XXVIC in FIG. 26A.
Figure 27A:
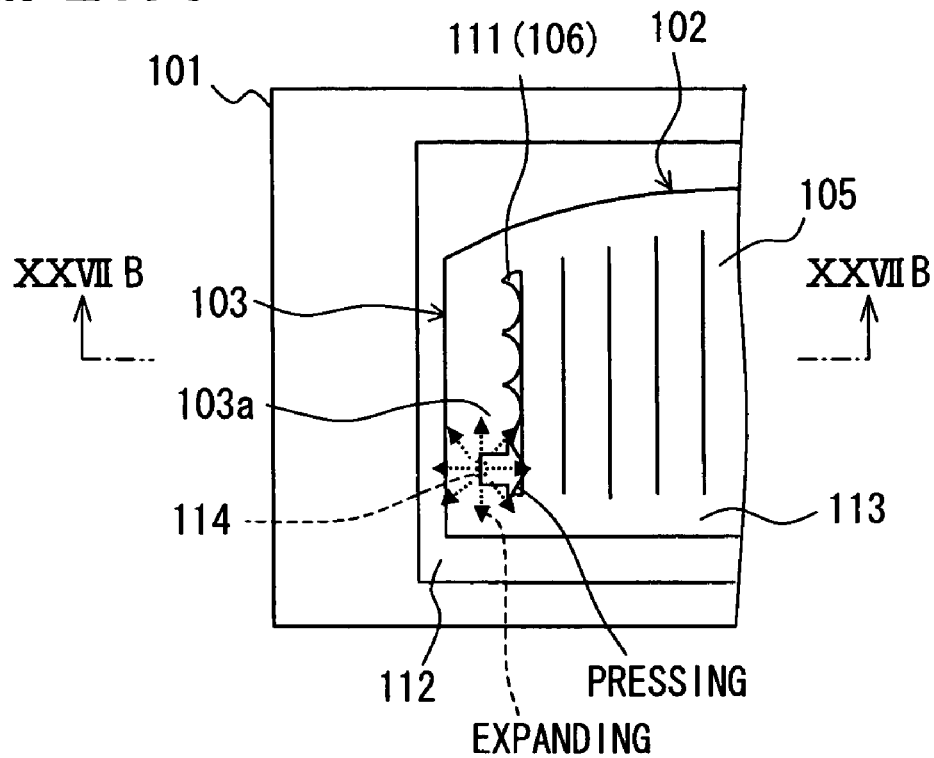
FIG. 27A is a schematic top view showing a part of the optical device in a pressing step according to the seventh embodiment.
Figure 27B:
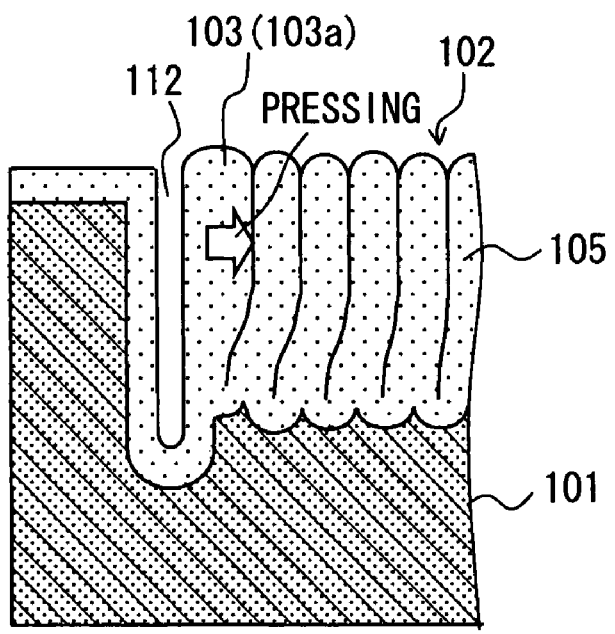
FIG. 27B is a cross-sectional view taken along the line XXVIIB-XXVIIB in FIG. 27A.

Now, a method of manufacturing the optical device 100 according to this embodiment will be described using FIGS. 24 to 27. FIGS. 24 and 25 show a trench etching step (first step), in which FIG. 24 is a plan view of the silicon substrate 101, and FIG. 25 is a sectional view taken along the line XXV-XXV in FIG. 24. FIGS. 26A to 26C show a thermal oxidation step (second step), in which FIG. 26A is a plan view of the silicon substrate 101, FIG. 26B is a sectional view taken along the line XXVIB-XXVIB in FIG. 26A, and FIG. 26C is a sectional view taken along the line XXVIC-XXVIC in FIG. 26A. FIGS. 27A and 27B show a pressing step (third step), in which FIG. 27A is a plan view of the silicon substrate 101 and FIG. 27B is a sectional view taken along the line XXVIIB-XXVIIB in FIG. 27A. For convenience, in FIG. 24, the representation of the mask will be omitted. Furthermore, even in FIGS. 24 to 27B, only a part of the optical device in the juxtaposition direction is shown for convenience. In this embodiment, at least a part of a basic manufacturing method may be the same as that proposed by JP-A-2004-271756.

First, patterning of the microlens 102 including the pressing structure 103 is performed to the silicon substrate 101 using the mask 109. As shown in FIGS. 24 and 25, the etching is performed from openings of the mask 109 to form first trenches 110, second trenches 111, and an outer peripheral trench 112. This trench etching corresponds to the first step. The first trenches 110 are adapted to separate a plurality of columnar structures 105. A plurality of first trenches 110 are formed parallel to the optical axis in the same direction. The second trenches 111 are adapted to separate the columnar structures 105 on the end from the pressing structure 103 in the juxtaposition direction of the columnar structures 105, and the outer peripheral trench 112 is to define the shapes of the microlens 102 and the pressing structures 103.

This embodiment has the first feature that the width of the first trench 110 and the width of the columnar structure 105 in the juxtaposition direction are set in such a manner that voids derived from the first trenches 110 intentionally remain between the adjacent columnar structures 105 at a time when the second step to be described later is completed (when the whole columnar structures 105 are replaced with the silicon oxide by thermal oxidation). Experience shows that the formation of the thermal oxide film proceeds inside and outside of the silicon surface at a ratio of 0.45:0.55. In this embodiment, in order to efficiently and thermally oxidize the whole of the plurality of columnar structures 105 (to replace them by the silicon oxide), the width of the first trenches 110 is set to a certain value, and also the width of the columnar structures 105 is set to a certain value. Therefore, as shown in FIG. 24, when T1 is the width of the first trench 110 and W1 is the width of the columnar structure 105 in the juxtaposition direction, the first trench 110 and the columnar structure 105 are set to satisfy the following formula 1.

$$T1 > 1.22 \times W1 \qquad \text{(Formula 1)}$$

By setting the first trenches 110 and the columnar structures 105 so as to satisfy the formula 1, the voids derived from the first trench 110 can remain intentionally between the adjacent columnar structures 105 at the time of the completion of the second step.

In this embodiment, the width of the second trench 111 and the width and arrangement of the pressing structure 103 are set in the juxtaposition direction in such a manner that the columnar structures 105 disposed via the voids derived from the first trenches 110 are pressed in the juxtaposition direction in the below-mentioned third step, using the expansion of volume of the pressing structures 103 caused by replacing the silicon with the silicon oxide in the thermal oxidation. In the embodiment, the pressing structures 103 are thermally oxidized together with the columnar structures 105 in the thermal oxidation step (second step) so as to simplify the manufacturing process. Thus, the width of the second trench 111 and the width and arrangement of the pressing structure 103 are set in the juxtaposition direction such that remaining silicon not thermally oxidized exists within the pressing structure 103, while a void derived from the second trench 111 exists at the time of the completion of the second step. Specifically, the pressing structure 103 has a thick pressing portion 103a having a width wider than that of the columnar structure 105 in the juxtaposition direction. A plurality of pressing portions 103a are provided at predetermined intervals along the extending direction of the columnar structures 105 (optical axis direction) such that the void derived from the second trench 111 exists at the time of the completion of the second step. More specifically, as shown in FIG. 24, when T2 is the width of the second trench 111 between the pressing portion 103a and the columnar structure 105 opposed to each other, and W2 is the width of the pressing portion 103a of the pressing structure 103 (W2>W1) in the juxtaposition direction, the widths of the second trench 111 and the pressing structure 103 are set so as to satisfy the relationship indicated by the following formula 2.

$$T2 < 0.61 \times (W1 + W2) \qquad \text{(Formula 2)}$$

By substituting W1=αW2 (0<α<1) into the above formula, the formula 2 can be represented by the following formula 3.

$$T2 < 0.61 \times W2 \times (1+\alpha) \qquad \text{(Formula 3)}$$

Because of 0<α<1, the formula 3 can be replaced with the following formula 4.

$$0.61 \times W2 < T2 < 1.22 \times W2 \qquad \text{(Formula 4)}$$

In this way, the second trench 111 and the pressing structure 103 are set so as to satisfy the formula 2 (or the formula 3 or 4) with the void from the second trench 111 existing at the time of the completion of the second step. Thus, the columnar structures 105 can be pressed in the juxtaposition direction by the expansion of volume of the pressing structures 103 in the third step.

When the adjacent columnar structures 105 are brought into press-contact with each other by being pressed by the pressing structures 103 (pressing portions 103a) before the columnar structures 105 are completely oxidized (during the second step), oxygen may not be supplied well to the columnar structures 105, whereby an unoxidized silicon area may remain in the columnar structure 105. Thus, the pressing structure 103 and the second trench 111 are set such that the void derived from the first trench 110 remains between the adjacent columnar structures (the adjacent columnar structures 105 do not contact with each other) at the time of the completion of the second step, regardless of whether or not the pressing structure 103 comes into contact with the columnar structure 105 at the end.

When the plurality of pressing portions 103a are provided along the extending direction of the columnar structures 105 (optical axis direction), these pressing portions 103a can press the columnar structures 105 subsequently uniformly in the extending direction in a pressing step (third step) as mentioned in this embodiment. In the embodiment, the pressing structure 103 is constructed such that the plurality of pressing portions 103a having a semicircular plane are connected to thin portions 103b, each of which is thinner than the pressing portion 103a, in the juxtaposition direction along the extending direction of the columnar structures 105 as shown in FIG. 24. This construction has larger mechanical strength than that of a construction including the single pressing portion 103a, thereby reducing or preventing the breakage of the construction, for example, by cleaning after the etching process. Note that the width of the thin portion 103b is the same as that of the columnar structure 105 in the juxtaposition direction.

An outer peripheral trench 112 in the embodiment is formed such that the outermost peripheral portion defining the shape of the microlens 102, that is, the outermost part (outline) of the lens forming area is connected with the silicon layer 113 having a predetermined width (hereinafter referred to as an "outline structure 113"). Since the light incident surface and light emission surface have respective curvatures defined by the pattern of the outline structure 113, any surface of the microlens 102 can be obtained by the pattern. It takes much time to oxidize the connection portion of the outline structure 113 with the columnar structure 105 or the pressing structure 103 (a T-like portion or a L-like portion) as compared to that for oxidation of other parts. In order to decrease the silicon residues, the width of the outline structure 113 is preferably set equal to or smaller than that of the columnar structure 105. In this embodiment, the width of the outline structure 113 is a little smaller than that of the columnar structure 105 so as not to cause the silicon unoxidized residues in the connection portion at the time of the completion of the thermal oxidation step (the second step). In the embodiment, however, in the pressing step (third step) to be described later, the columnar structures 105 are pressed by the pressing structures 103 in the juxtaposition direction under the thermal oxidation condition, and are integrated into one piece by fusion. For this reason, the outline structure 113 can have any width that causes the outline structure to be completely oxidized in the third step. Even if the outline structure 113 has a silicon unoxidized area at the time of the completion of the second step, the connection portion between the columnar structure 105 and the outline structure 113 can be prevented from extending in the juxtaposition direction due to the oxidation of the unoxidized area by the pressing structures 103 in the third step.

The outer peripheral trench 112 is formed to have a sufficiently large trench width as compared to those of the first trench 110 and the second trench 111 such that the void remains in the trench at the time of formation of the optical device 100. This can avoid buckling due to a difference in coefficient of linear expansion between the silicon oxide and the silicon. Furthermore, the outer peripheral trench 112 is etched more deeply than the first trench 110 and the second trench 111 by the microloading effect. Thus, in the optical device 100 shown in FIG. 20, the microlens 102 including the pressing structure 103 is connected to the silicon substrate 101 via the pedestal portion 107 made of silicon having the same shape as that of the silicon substrate 101 in the plane direction of the substrate, thereby avoiding the inhibition of an optical path in the light incidence and emission.

In order to obtain a stereoscopic lens shape, it is necessary to form trenches having a higher aspect ratio (depth/width) in the trench etching step (first step). Furthermore, the vertical degree of a sectional profile of the trench needs to be ensured so that no clearance remains after the thermal oxidation. In contrast, in the embodiment, a protective oxide film is formed on the inner surface (e.g., the side and the bottom surface) of the trench formed, the oxide film on the bottom surface is removed by reactive ion etching, and the etching is subsequently applied to the silicon substrate 101 from the bottom surface using the etching technique (so-called DRIE method) as disclosed in JP-A-2000-299310. In this way, the forming step of the protective oxide film and the etching step of the bottom of the trench are repeated. This can form the trench whose sectional profile is extremely vertical to have the aspect ratio of about 60. In the embodiment, because the trenches 110 to 112 having the high aspect ratio can be formed by the DRIE method, the columnar structure 105 tends to be deformed easily, which can provide the microlens 102 integrated by pressing in the third step.

After the trench etching step (the first step), the entire silicon substrate 101 is subjected to anneal processing in hydrogen atmosphere, thereby decreasing the surface roughness of side walls of each of the trenches 110 to 112. Thus, the flatness of the trench side wall surface is improved, so that the lens surface (incident surface 102a and emission surfaced 102b) having a flat surface can be obtained by the thermal oxidation. This technology is disclosed in JP-A-2002-231945.

After the anneal process, the mask 109 is removed by immersion into a hydrofluoric acid solution or the like. In the second step, the thermal oxidation is performed until the silicon in the entire columnar structures 105 is replaced by the silicon oxide. The columnar structure 105 and the outline structure 113 are supplied with oxygen enough to oxidize the entire structures via the first trench 110 and the outer peripheral trench 112 under the condition preset in the first step. As shown in FIGS. 26A, 26B, and 26C, the silicon in the structures are completely replaced by the silicon oxide in the thermal oxidation step (second step). The first trench 110 has its part filled by the expansion of volume of the columnar structure 105 and the outline structure 113 (replacement with the silicon oxide), while maintaining the shape extending in the optical axis direction under the condition preset in the first step. That is, the adjacent columnar structures 105 do not contact with each other, and the void derived from the first trench 110 remains between the columnar structures 105.

The thin portion 103b of the pressing structure 103 having the same width as that of the columnar structure 105 is completely replaced with the silicon oxide by the thermal oxidation. In contrast, the pressing portion 103a, which is thick, contains an unoxidized area 114 in which the silicon remains unoxidized under the completion of the second step as shown in FIGS. 26A and 26B. In this embodiment, the pressing portion 103a expanding in volume, and which is partly replaced by the silicon oxide, is in contact with the adjacent pressing portion 103a in the optical axis direction, and also in contact with the columnar structure 105 at the end in the juxtaposition direction to such a degree that the adjacent columnar structures 105 do not contact with each other. The second trench 111 has its part filled by the expansion of volume of the columnar structure 105, the pressing structure 103, and the outline structure 113 (silicon oxide), while a plurality of voids derived from the second trench 111 remain distributed in the optical axis direction under the condition preset in the first step as shown in FIGS. 26A and 26B.

After the completion of the second step, pressing of the plurality of columnar structures 105 is performed in the juxtaposition direction in the third step, while subsequently continuing the thermal oxidation condition in the second step. In this embodiment, the thermal oxidation process is divided into the second step and the third step. In the third step, the unoxidized area 114 of the pressing structure 103 remaining unoxidized in the second step is oxidized. Thus, as shown in FIG. 27A, the unoxidized area 114 is replaced by the silicon oxide, and the pressing structure 103 (pressing portion 103a) is adapted to press the plurality of columnar structures 105 (as indicated by the outline arrow in FIGS. 27A and 27B) from one end to the other end by the expansion in volume (as indicated by the arrow of the broken line in FIG. 27A). Moreover, the silicon oxide has fluidity at a high temperature (for example, 1000° C. or more) in the thermal oxidation, whereby the silicon oxides contacted with each other are integrated by fusion.

In this embodiment, the expansion amount (stroke amount) toward the pressing side in the juxtaposition direction with the unoxidized area 114 of the pressing portion 103a being completely oxidized is previously set in the first step so as to provide enough pressing force to deform the plurality of columnar structures 105 so as to integrate them by fusion. Thus, the plurality of columnar structures 105 to which the pressing is applied by the pressing structure 103 are deformed in the juxtaposition direction with the connection portion with the silicon substrate 101 serving as a fulcrum. The adjacent columnar structures 105 are brought into press-contact with each other and integrated by fusion to form the silicon oxide block (microlens 102). Note that in the embodiment, the pressing structures 103 are provided on both ends of the plurality of columnar structures 105 in the juxtaposition direction. By the pressing force from both ends, the left columnar structure 105 with respect to the center columnar structure 105 in the juxtaposition direction has the upper part thereof from the connection portion with the silicon substrate 101 to be deformed rightward from the vertical direction with respect to the plane of the silicon substrate 101. The right columnar structure 105 has the upper part thereof from the connection portion with the silicon substrate 101 to be deformed leftward from the vertical direction with respect to the plane of the silicon substrate 101. This results in the structure shown in FIGS. 22 and 23.

The silicon oxide flows into the voids derived from the second trenches 111 by the oxidation of the unoxidized area 114 of the pressing structure 103. Thus, the voids remain as the void portions 106, which are smaller than those in the second step, with the unoxidized area 114 completely oxidized (in the state of completion of the third step). In this way, when the void portions 106 remain around the pressing portions 103a causing the pressing force after the completion of the third step, the unoxidized area 114 can surely be supplied with oxygen which causes enough pressing force (stroke amount of the pressing structure 103) to integrate the columnar structures 105 in the third step.

After each step described above, dicing cut is performed in a position superimposed on the outer peripheral trench 112 around the lens. This can maintain the outer peripheral trench 112 as the surrounding groove 108 to form the optical device 100 including the microlens 102 shown in FIGS. 20 to 23.

Thus, in this method of manufacturing the optical device 100 according to the embodiment, the first trenches 110 and the columnar structures 105 are formed in the first step such that the voids derived from the first trenches 110 intentionally remain between the adjacent columnar structures 105 at the time of the completion of the second step. This can completely oxidize the columnar structures 105 in the second step (this can make the state without silicon residues that are opaque to the light). In the third step, the plurality of columnar structures 105 are pressed in the juxtaposition direction under the thermal oxidation condition, so that the adjacent columnar structures 105 are brought into press-contact with each other and integrated by fusion, thereby enabling formation of the silicon oxide block (microlens 102). The manufactured microlens 102 does not have any silicon residue that is impermeable to the light, while the level of voids is at least decreased (or voids are eliminated) as compared to the level of voids caused by variations in the conventional process. Accordingly, the optical device 100 including the microlens 102 can be an optical device having good optical transparency.

Moreover, in this embodiment, the pressing structure 103 is formed on the same silicon substrate 101 as the columnar structure 105, and the expansion of the pressing structure 103 by oxidation is used as a pressing force, causing the plurality of columnar structures 105 to be brought into press-contact with each other, thereby forming the integrated microlens 102. In this way, the pressing source of the columnar structures 105 in the juxtaposition direction can be configured on the same silicon substrate 101 as the columnar structure 103. Also, in the third step, the pressing structure 103 is thermally oxidized on the same condition as that in the second step, thereby enabling simplification of the manufacturing process.

Furthermore, in this embodiment, the second trenches 111 and the pressing structures 103 are formed in the first step such that the voids (void portions 106) derived from the second trenches 111 remain at the time of the completion of the third step. Therefore, in the third step, oxygen can surely be supplied to the unoxidized area 114 in an amount that causes enough pressing force to integrate the columnar structures 105. Supplying more oxygen to the unoxidized area 114 can improve the pressing force. However, even if no void portion 106 remains at the time of the completion of the third step (even if the voids derived from the second trenches 111 are completely filled with the silicon oxide), a microlens 102 having substantially the same optical transparency as that of the microlens 102 of the embodiment can be formed under the following condition. That is, the voids derived from the second trenches 111 may remain at least at the time of the completion of the second step, and also oxygen has only to be supplied via the voids to the unoxidized area 114 in an amount that causes enough pressing force to integrate the columnar structures 105.

Furthermore, in this embodiment, the second trenches 111 and the pressing structures 103 are formed in the first step such that a plurality of voids (void portions 106) derived from the second trenches 111 remain distributed at the time of the completion of the third step. Thus, since the oxygen can be supplied efficiently to the unoxidized area 114 of the pressing structure 103 via the voids in the third step, variations in pressing the columnar structures 105 in the direction perpendicular to the juxtaposition direction can be decreased. This can further improve the optical transparency of the microlens 102.

Although in the embodiment, the exemplary pressing structures 103 are disposed at both ends of the columnar structures 105, the pressing structure 103 may be provided only at one end of the columnar structures 105 in the juxtaposition direction, thereby allowing the pressing force to be applied to the columnar structures 105 so as to integrate the structures in the third step. Note that when the pressing structure is disposed on only one side, the pressing force may escape to the outside in the pressing direction. Provision of the pressing structures 103 at both ends, as shown in the present embodiment, causes pressing forces directed reversely at the same time, so that one pressing structure 103 can restrain escape of the pressing force from the other pressing structure 103. Therefore, the plurality of columnar structures 105 can be pressed more efficiently to further improve the optical transparency of the microlens 102.

In this embodiment, the DRIE method forms the trenches having the high aspect ratio as the first trench 110. In this case, since the rigidity of the columnar structure 105 is low, the columnar structures 105 pressed tend to be deformed in the juxtaposition direction, so that the adjacent columnar structures 105 can be brought into press-contact with each other to further decrease or eliminate the voids in the microlens 102 in the third step. This can improve the optical transparency of the microlens 102.

Although a single crystal silicon is used as the silicon substrate 101, a substrate doped with a high concentration (for example, $10^{18}$ cm$^{-3}$ or more) of impurities may be used as the silicon substrate 101. Such a silicon substrate 101 doped with the impurities (for example, boron or phosphorus) in high concentration has a low glass transition point in the silicon oxide state as compared to that of the silicon substrate 101 into which no impurities are introduced or into which impurities are doped in low concentration. Thus, the silicon oxides which are brought into contact with each other by being pressed can intend to be fusion bonded in the third step.

This embodiment shows an example in which the extending direction of the columnar structures 105 (the extending direction of the first trenches 110) is parallel to the optical axis of the microlens 102. This arrangement can reduce a decrease in optical transparency due to light scattering or the like as compared with the case in which the columnar structure 105 (first trench) is provided to extend, for example, so as to be perpendicular to the optical axis of the microlens 102. However, the columnar structure 105 (first trench) may be provided to extend, for example, so as to be perpendicular to the optical axis of the microlens 102. In this case, the light enters the microlens 102 via the pressing structure 103 and then is emitted from the microlens 102 via the pressing structure 102. In the case of employing such an arrangement, it is desirable that the unoxidized area 114 is completely oxidized and the pressing structure 103 is made of only the silicon oxide at the time of the completion of the third step in order to improve the transmittance. More preferably, at the time of the completion of the third step, the voids derived from the second trenches 111 may be filled by the expansion of the unoxidized area 114 by the oxidation and the void portions 106 is preferably as small as possible (more preferably, in a state of no void portion 106).

Eighth Embodiment

Figure 28A:
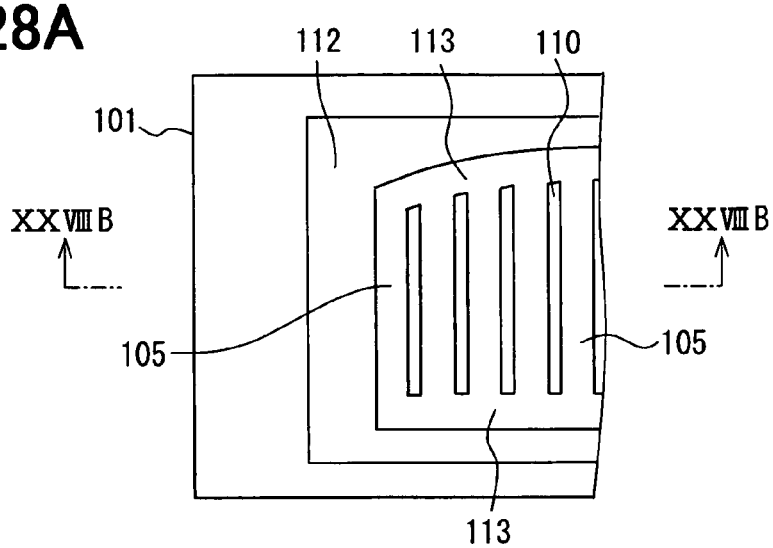
FIG. 28A is a schematic top view showing a part of an optical device in a thermal oxidation step according to an eighth embodiment of the present invention.
Figure 28B:
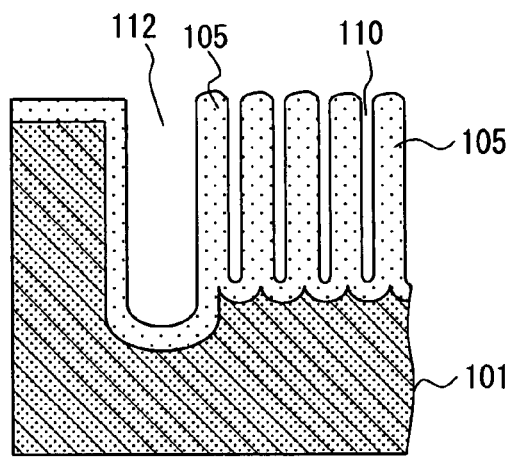
FIG. 28B is a cross-sectional view taken along the line XXVIIIB-XXVIIIB in FIG. 28A.
Figure 29:
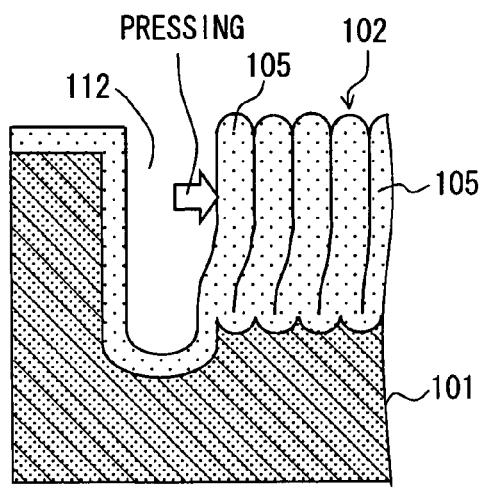
FIG. 29 is a sectional view showing a part of the optical device in a pressing step according to the eighth embodiment.

Now, an eighth embodiment of the invention will be described with reference to FIGS. 28A, 28B and 29. FIGS. 28A and 28B show a thermal oxidation step (second step) in a method of manufacturing the optical device 100 of the eighth embodiment, in which FIG. 28A is a plan view thereof, and FIG. 28B is a sectional view taken along the line XXVIII-XXVIII of FIG. 28A. FIG. 29 is a sectional view showing a pressing step (third step) in the manufacturing method of the optical device 100. In FIGS. 28A, 28B and 29, only parts in the juxtaposition direction are illustrated for convenience, like in FIGS. 24 to 27B shown in the seventh embodiment.

Most of the optical device 100 according to the eighth embodiment and the method of manufacturing the same are common to those in the seventh embodiment. In the following, a detailed description of the common portions will be omitted, and different points therefrom will be mainly described. It is noted that, components of this embodiment having the same functions as those of the seventh embodiment are designated by the same reference numerals.

In the example of the above-described seventh embodiment, the pressing structures 103 are provided on the silicon substrate 101 provided with the columnar structures 105, so that the columnar structures 105 are deformed in the juxtaposition direction by the expansion of the pressing structures 103 by the thermal oxidation, and integrated by fusion to form the microlens 102. In contrast, in this embodiment, an external force from the outside of the silicon substrate 101 is applied to cause the columnar structures 105 to be deformed in the juxtaposition direction and integrated by fusion, thereby forming the microlens 102.

The manufacturing method of the eighth embodiment is the same as that of the seventh embodiment up to the second step, except that the pressing structure 103 is not provided. Thus, at the time of the completion of the second step by the thermal oxidation, in this embodiment, the plurality of columnar structures 105 are arranged side by side via voids derived from the first trenches 110, and the columnar structures 105 at ends in the juxtaposition direction are sandwiched between the voids derived from the first trenches 110 and the outer peripheral trench 112, as shown in FIGS. 28A and 28B.

After the second step, the plurality of columnar structures 105 are pressed (as indicated by the outline arrow shown in FIG. 29) from one end in the juxtaposition direction, for example, by a pressing member (not shown) under the condition where the silicon oxides are fusion bonded, as shown in FIG. 29. Thus, the plurality of columnar structures 105 are deformed in the juxtaposition direction, while the connection portion with the silicon substrate 101 serves as a fulcrum. The adjacent columnar structures 105 are brought into press-contact with each other and integrated by fusion to form the silicon oxide block (microlens 102). In this way, the optical device 100 including the microlens 102, which has a structure (not shown) without the pressing structure 103 (and void portions 106) shown in FIGS. 20 to 23, can be formed.

Thus, in the method of manufacturing the optical device 100 according to this embodiment, the optical device 100 including the microlens 102 can serve as an optical device having good light transparency, like the manufacturing method shown in the seventh embodiment.

Furthermore, the pressing structure 103 described in the seventh embodiment is not needed, resulting in simple structure. Since the external force is applied to the optical device, the pressing force can be adjusted easily.

In the pressing step (third step), the pressing may be applied under the condition in which the silicon oxides are fusion bonded. This condition is not limited to the condition where the silicon substrate 101 is thermally oxidized like the seventh embodiment.

Like the optical device 100 shown in the seventh embodiment, the optical device 100 formed using the manufacturing method according to this embodiment does not have any silicon residue that is impermeable to the light, while the level of voids is at least decreased (or voids are eliminated) as compared to the level of voids caused by variations in the conventional process.

Since the optical device 100 does not have the pressing structure 103 of the seventh embodiment, even when the columnar structures 105 (first trenches) are provided to extend, for example, so as to be perpendicular to the optical axis of the microlens 102, the optical device 100 can improve the optical transmittance as compared with that of the structure shown in the seventh embodiment.

The application of external force may be performed at only one end of the plurality of columnar structures 105 in the juxtaposition direction, or may be performed on both ends thereof at the same time. Preferably, the reverse external forces are applied at the same time, thereby pressing the plurality of columnar structures 105 more efficiently, so that the light transparency of the microlens 102 can be further improved.

Ninth Embodiment

Figure 30:
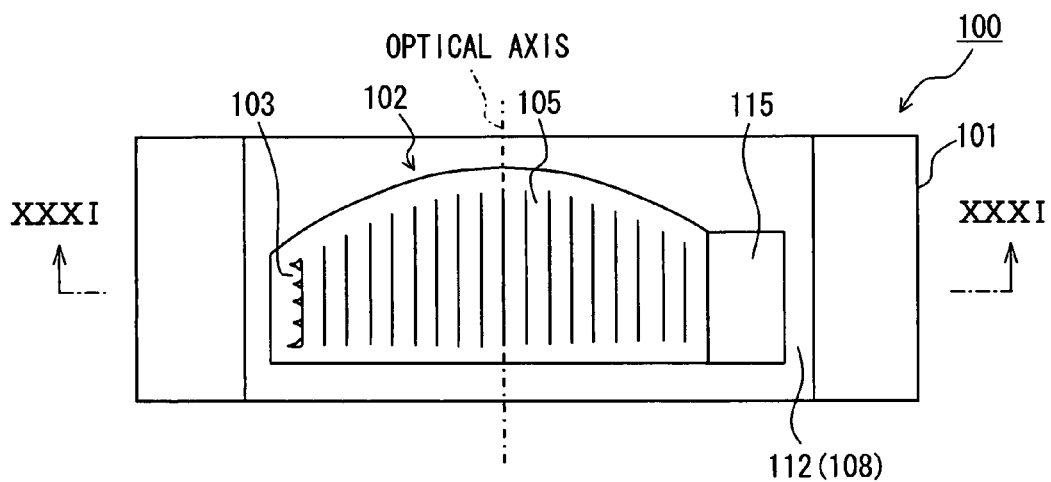
FIG. 30 is a schematic top view showing an optical device according to a ninth embodiment of the present invention.
Figure 31:
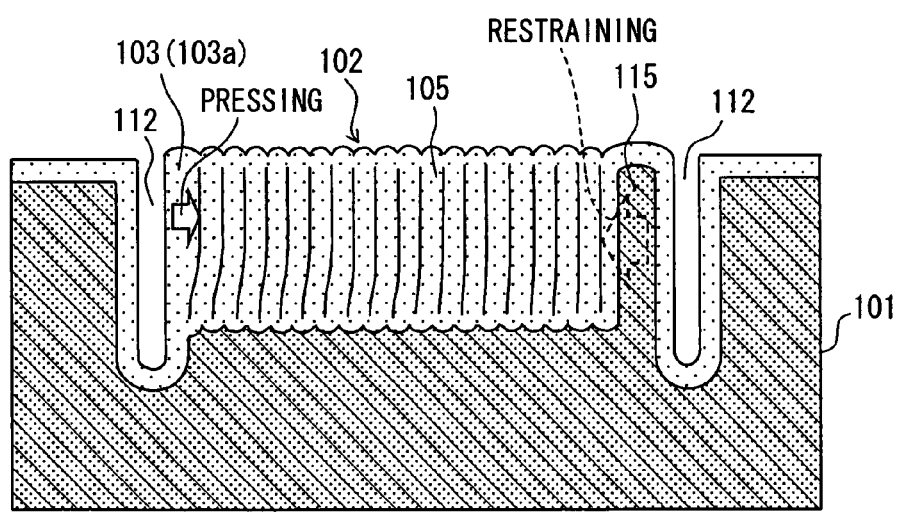
FIG. 31 is a cross-sectional view taken along the line XXXI-XXXI in FIG. 30, in a pressing step according to a manufacturing method of the ninth embodiment.

Now, a ninth embodiment of the invention will be described based on FIGS. 30 and 31. FIG. 30 shows a top plan view showing a schematic structure of the optical device 100 according to the ninth embodiment. FIG. 31 is a diagram showing the pressing step (third step) in a method of manufacturing the optical device 100 according to the ninth embodiment.

Most of the optical device 100 according to the ninth embodiment and the method of manufacturing the same are common to those in the seventh embodiment. In the following, a detailed description of the common portions will be omitted, and different points therefrom will be mainly described. It is noted that, components of this embodiment having the same functions as those of the seventh embodiment are designated by the same reference numerals.

In the seventh embodiment, the pressing structures 103 are respectively provided on both ends of the plurality of columnar structures 105 in the juxtaposition direction, causing the reverse pressing forces in the third step, thereby efficiently pressing the columnar structures 105. In contrast, the ninth embodiment, the pressing structure 103 is provided at one end of the plurality of columnar structures 105 in the juxtaposition direction, and that a first expansion restraining structure 115 having a columnar shape is provided on the other end for restraining the deformation of the columnar structure 105 toward the side opposite to the pressing structure 103 in the juxtaposition direction in the third step.

The manufacturing method of this embodiment includes the same steps as the first to third steps shown in the seventh embodiment, except for a mask pattern in performing trench etching in the first step. The first expansion restraining structure 115, not shown in the first and second steps, is formed on the columnar structure 105 at the end opposed to the pressing structure 103 in the juxtaposition direction via the first trench 110 disposed therebetween in the first step. Furthermore, the first expansion restraining structure 115 is set to have the width in the juxtaposition direction that is wilder than the widths of at least the columnar structure 105 and the pressing structure 103 (pressing portion 103a). Furthermore, the first expansion restraining structure 115 is set to have such rigidity as to be hardly deformed even when the columnar structure 105 are pressed to be deformed in the third step. For example, the width of the first expansion restraining structure 115 is five times or more larger than that of the columnar structure 105. The first expansion restraining structure 115 may be an independent structure from the columnar structures 105, but is connected with the columnar structures 105 by the outline structure 113 in the embodiment. Upon completion of the second step by the thermal oxidation, the first trench 110 between the columnar structure 105 and the first expansion restraining structure 115 has a part thereof that is filled by expansion of the columnar structure 105, the outline structure 113, and the first expansion restraining structure 115 (by replacement with the silicon oxide), while maintaining the shape that extends in the optical axis direction under the condition previously set in the first step.

As shown in FIG. 31, the plurality of columnar structure 105 pressed by the pressing structure 103 (as indicated by the outline arrow shown in FIG. 31) are deformed toward the first expansion restraining structure 115 side in the juxtaposition direction with the connection portion with the silicon substrate 101 serving as a fulcrum in the third step. At this time, the deformation of the columnar structure 105 is received by the first expansion restraining structure 115 having a high rigidity. That is, the first expansion restraining structure 115 restrains the deformation of the columnar structure 105 toward the outside of the first expansion restraining structure 115 (as indicated by the outline dotted line shown in FIG. 11). Accordingly, the plurality of columnar structures 105 are efficiently pressed and integrated by fusion to form the microlens 102. The first expansion restraining structure 115 has a surface made of the silicon oxide, and the unoxidized silicon area provided therein at the time of the completion of the third step.

In this way, in the method of manufacturing the optical device 100 of this embodiment, the adjacent columnar structures 105 can be effectively brought into press-contact with each other between the pressing structure 103 and the first expansion restraining structure 115, in the same manner as the manufacturing method of the seventh embodiment. Therefore, the optical device 100 including the microlens 102 can be an optical device having a better light transparency.

Therefore, as shown in FIG. 30, the optical device 100 formed using the manufacturing method of this embodiment does not have any silicon residue that is impermeable to the light, while the level of voids is at least decreased (or voids are eliminated) as compared to the level of voids caused by variations in the conventional process, like the seventh embodiment. The microlens 102 as shown in FIG. 30 is configured such that, as shown in FIG. 31, the plurality of columnar structures 105 each of which has a part above the connection portion with the silicon substrate 101 deformed by the pressing force from one end toward the first expansion restraining structure 115 side with respect to the vertical direction in the plane direction of the silicon substrate 101. In even the structure to which the pressing is applied from only one side, the width of an interface with the silicon substrate 101 is wider than that of the upper part of the structure with respect to the interface in the juxtaposition direction of the columnar structures 105, as mentioned in the seventh embodiment.

In the manufacturing method of the embodiment, the columnar structures 105 are pressed between the pressing structure 103 and the first expansion restraining structure 115 in the juxtaposition direction. Therefore, the outline structure 113 has unoxidized silicon area (for example, a T-shaped connection portion) at the time of the completion of the second step. In the third step, even when the unoxidized area is oxidized, the connection portion between the columnar structures 105 and the outline structure 113 can be restrained from expanding in the juxtaposition direction between the pressing structure 103 and the first expansion restraining structure 115.

Tenth Embodiment

Figure 32A:
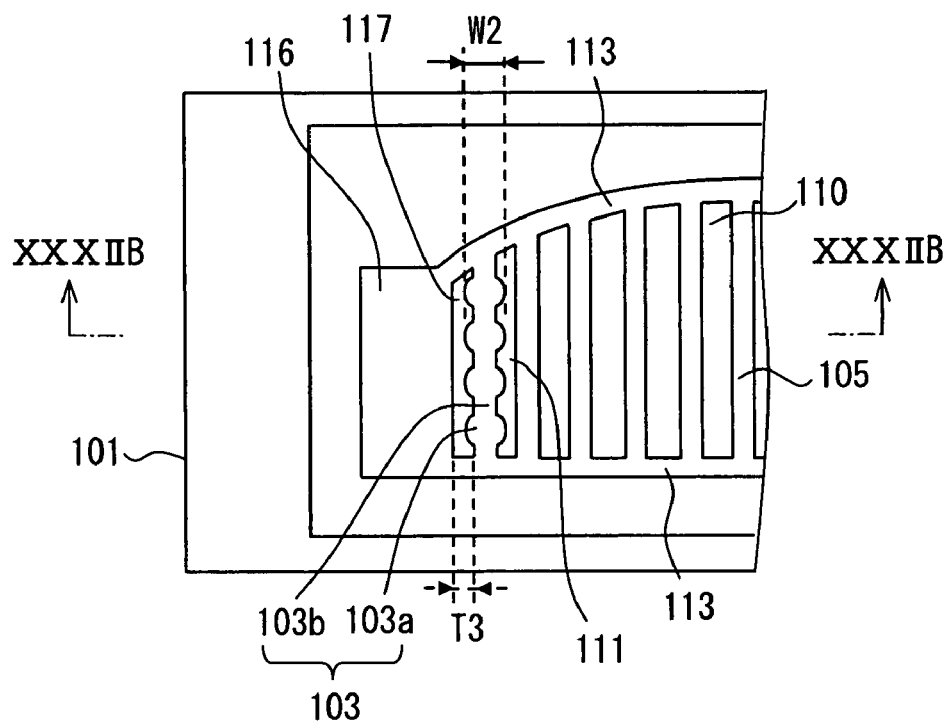
FIG. 32A is a schematic top view showing a part of an optical device in a trench etching step (first step) according to a tenth embodiment of the present invention.
Figure 32B:
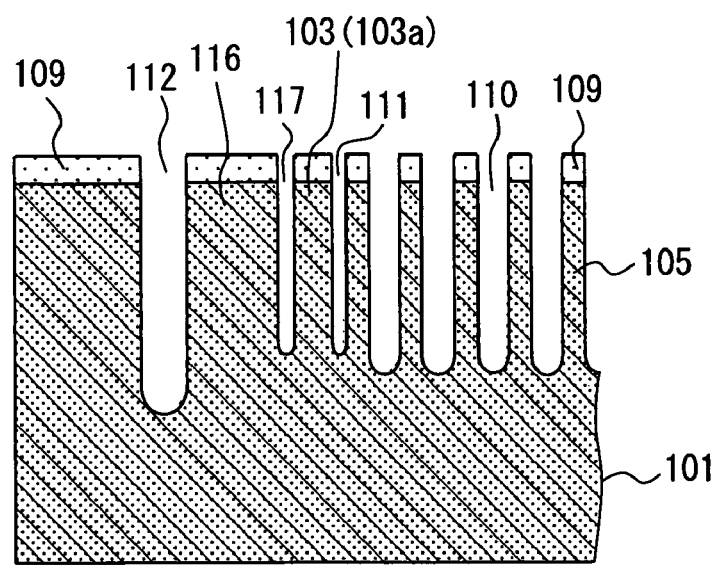
FIG. 32B is a cross-sectional view taken along the line XXXIIB-XXXIIB in FIG. 32A.
Figure 33A:
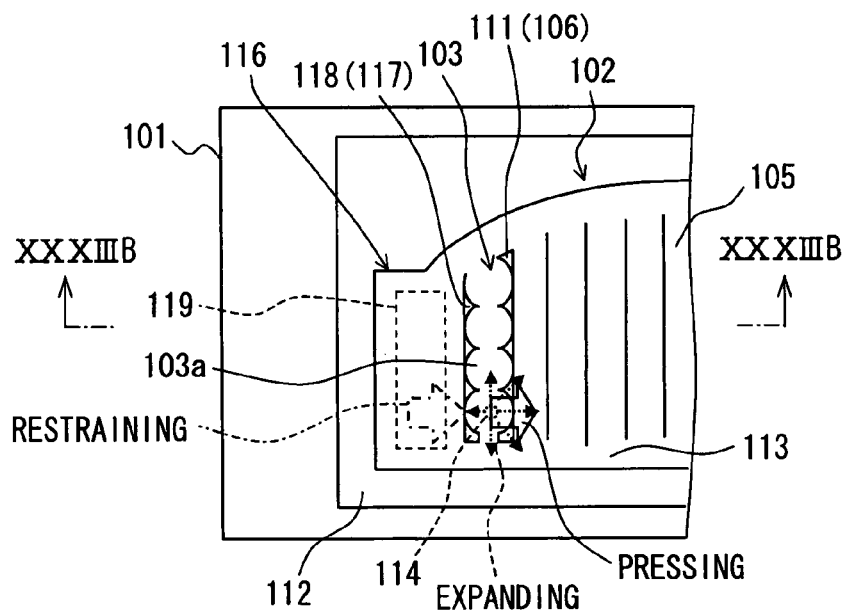
FIG. 33A is a schematic top view showing a part of an optical device in a pressing step (third step) according to the tenth embodiment.
Figure 33B:
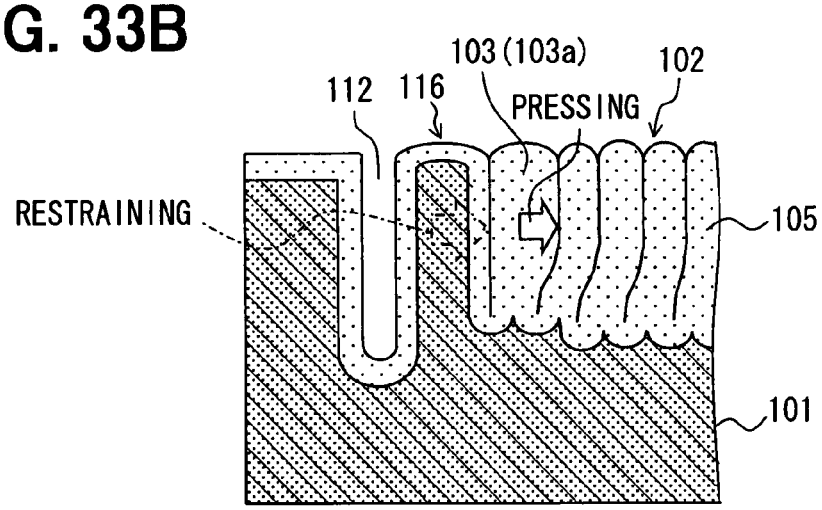
FIG. 33B is a cross-sectional view taken along the line XXXIIIB-XXXIIIB in FIG. 33A.
Figure 34:
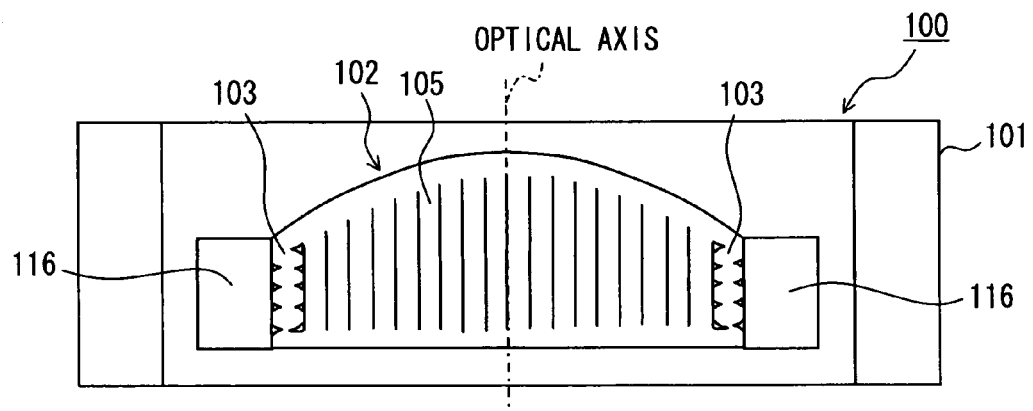
FIG. 34 is a schematic top view showing the optical device according to the tenth embodiment.

Now, a tenth embodiment of the invention will be described with reference to FIGS. 32A to 34. FIGS. 32A and 32B show a trench etching step (first step) in the manufacturing method of the optical device 100 according to the tenth embodiment, in which FIG. 32A is a plan view, and FIG. 32B is a sectional view taken along the line XXXIIB-XXXIIB of FIG. 32A. FIGS. 33A and 33B show a pressing step (third step) in the manufacturing method of the optical device 100, in which FIG. 33A is a plan view, and FIG. 33B is a sectional view taken along the line XXXIIIB-XXXIIIB of FIG. 33A. FIG. 34 is a top plane view showing a schematic structure of the optical device 100 according to the tenth embodiment. In FIG. 33A, the representation of the mask 109 is omitted for convenience.

Most of the optical device 100 according to the tenth embodiment and the method of manufacturing the same are common to those in the seventh embodiment. In the following, a detailed description of the common portions will be omitted, and different points therefrom will be mainly described. It is noted that, components of this embodiment having the same functions as those of the seventh embodiment are designated by the same reference numerals.

The seventh embodiment shows the example in which the pressing structures 103 are provided adjacent to the ends of the plurality of columnar structures 105 in the juxtaposition direction, and each of the pressing structures 103 is defined by the second trench 111 and the outer peripheral trench 112. That is, the example of the seventh embodiment is shown in which in the third step in the expansion of the unoxidized area 114 of the pressing structure 103 by acid, a pressing force by the expansion of the unoxidized area toward the outside of the pressing structure 103 (toward the opposite side to the columnar structure 105) in the juxtaposition direction does not have an object of interest for transmission (in a free state), like the columnar structure 105. In contrast, in the tenth embodiment, a second expansion restraining structure 116 having a columnar shape is provided for restraining the deformation (expansion) toward the opposite side to the columnar structure 105 of the pressing structure 103, on the opposite side of the columnar structure 105 in the juxtaposition direction.

As shown in FIGS. 32A and 32B, the manufacturing method of this embodiment is the same as the first to third steps shown in the seventh embodiment except for the pattern of the mask 109 subjected to the trench etching in the first step. In this embodiment, as shown in FIG. 32A, the pressing structure 103 is configured in the first step such that the plurality of pressing portions 103a having a circular plane are connected along the extending direction of the columnar structures 105 by thin portions 103b, each of which is thinner than the pressing portion 103a. Thus, the width W2 of the pressing portion 103a in the juxtaposition direction is a diameter of a circle. The columnar second expansion restraining structure 116 standing on the upper surface of the silicon substrate 101 is formed on the opposite side to the columnar structure 105 in the juxtaposition direction with respect to the pressing structure 103 via a third trench 117 therebetween.

The second expansion restraining structure 116 has the width in the juxtaposition direction wider than that of at least pressing structure 103 (pressing portion 103a). The second expansion restraining structure 116 is set to have rigidity that hardly causes the structure 116 to be deformed even when the pressing structure 103 is expanded by the thermal oxidation. For example, the width of the second expansion restraining structure 116 is five times or more as large as that of the columnar structure 105. Furthermore, the second expansion restraining structure 116 may be independently from the columnar structure 105 and the pressing structure 103. In this embodiment, the second expansion restraining structure 116 is connected with the columnar structures 105 and the pressing structure 103 by the outline structure 113. Thus, the third trench 117 is enclosed by the pressing structure 103, the outline structure 113, and the second expansion restraining structure 116.

At the time of the completion of the second step (not shown), the pressing structure 103 (pressing portion 103a) may or may not be in contact with the second expansion restraining structure 116. When the pressing structure 103 (pressing portion 103a) and the second expansion restraining structure 116 are brought into contact with each other at the time of the completion of the second step, the expansion (deformation) of the pressing structure 103 (pressing portion 103a) toward the second expansion restraining structure 116 is restrained by the second expansion restraining structure 116, whereby an amount of expansion of the pressing structure toward the columnar structure 105 side, which is an opposite side of the second expansion restraining structure 116 side, becomes large. Thus, taking into consideration this expansion amount, the third trench 117 is set such that there remains a void derived from the first trench 110 between the adjacent columnar structures 105 at the time of the completion of the second step (such that the adjacent columnar structures 105 are not brought into contact with each other). The third trench 117 is set such that the pressing structure 103 (pressing portion 103a) and the second expansion restraining structure 116 are in contact with each other in the third step when the pressing structure 103 (pressing portion 103a) are not brought into contact with the second expansion restraining structure 116 at the time of the completion of the second step. In other words, the third trench 117 may be set such that the voids derived from the first trench 110 remain between the adjacent columnar structures 105 (while the adjacent columnar structures 105 are not in contact with each other) at the time of the completion of the second step, and that the pressing structure 103 (pressing portion 103a) and the second expansion restraining structure 116 are brought into contact with each other in at least the third step. The width T3 in the juxtaposition direction may be set preferably such that a void 118 derived from the third trench 117 may remain at the time of the completion of the second step, more preferably such that a plurality of voids 118 are distributed and maintained. In such setting, the plurality of voids 106, 118 remain around the pressing portions 103a in addition to the voids 106 derived from the second trenches 111, and thus the oxygen can be efficiently supplied to the unoxidized area 114 of the pressing portion 103a at the time of the completion of the second step. In this embodiment, the width T3 of the third trench 117 in the juxtaposition direction is set to the same value as that of the second trench 111. Therefore, at the time of the completion of the second step, the pressing portion 103a of the pressing structure 103 is brought into a little contact with the second expansion restraining structure 116, so that between both of them, the void portions 118 derived from the third trench 117 exist distributed.

The unoxidized area 114 of the pressing portion 103a of the pressing structure 103 remaining unoxidized at the time of the completion of the second step is thermally oxidized in the third step. This allows the unoxidized area 114 of the pressing portion 103a of the pressing structure 103 to be oxidized as shown in FIGS. 33A and 33B, and to expand as shown in FIG. 33A. At this time, in this embodiment, the expansion of the pressing portion 103a toward the second expansion restraining structure 116 side (as indicated by the arrow of a dotted line in FIG. 33A) is restrained by the second expansion restraining structure 116 having high rigidity (as indicated by the outline arrow of an alternate long and short dash line of FIGS. 33A and 33B). Thus, an amount of expansion of the pressing portion toward the columnar structure 105 side, which is the opposite side to the second expansion restraining structure 116, that is, the pressing force to the columnar structure 105 (as indicated by the outline arrow of a straight line in FIGS. 33A and 33B) becomes large. The structure except for the second expansion restraining structure 116 can be the same as that of the seventh embodiment (see FIG. 21), while the pressing force is larger. Thus, the plurality of columnar structures 105 are efficiently pressed and integrated by fusion to form the microlens 102. The second expansion restraining structure 116 has its surface made of the silicon oxide at the time of the completion of the third step, while containing the unoxidized area 119 of silicon as shown in FIG. 33A (area surrounded by a broken line shown in FIG. 33A).

Thus, in the manufacturing method of the optical device 100 according to this embodiment, the adjacent columnar structures 105 can be effectively brought into press-contact with each other, in the same manner as the manufacturing method shown in the seventh embodiment. Thus, the optical device 100 including the microlens 102 can be an optical device having the good light transparency. In particular, in this embodiment, the pressing structure 103 and the second expansion restraining structure 116 are respectively provided at both ends of the columnar structures 105 in the juxtaposition direction as shown in FIG. 34. Thus, in the third step, the reverse pressing forces improved by the effect of the second expansion restraining structure 116 can effectively cause the adjacent columnar structures 105 to be brought into press-contact with each other. Therefore, the optical device 100 including the microlens 102 can be an optical device having the better optical transparency.

Thus, the optical device 100 formed using the manufacturing method of this embodiment, as shown in FIG. 34, does not have any silicon residues that are impermeable to the light, like the optical device 100 of the seventh embodiment, while the level of voids is at least decreased (or voids are eliminated) as compared to the optical device 100 of the seventh embodiment.

Figure 35:
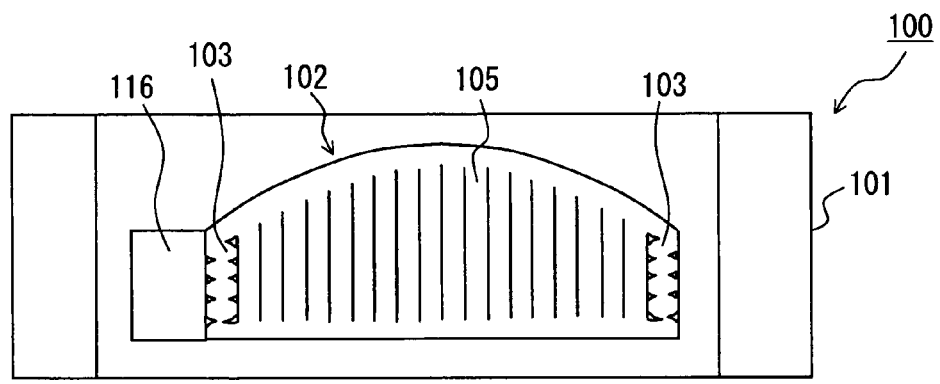
FIG. 35 is a schematic top view showing an optical device according to a modification of the present invention.

The second expansion restraining structures 116 are respectively provided at both ends of the columnar structures 105 in the juxtaposition direction as shown in FIG. 34 in this embodiment. However, the second expansion restraining structure 116 can be provided at only one end of the columnar structures 105 in the juxtaposition direction as shown in FIG. 35. FIG. 35 is a plan view showing a modified example.

Furthermore, in this embodiment, a member for restraining the expansion of the pressing structure 103 toward the side opposite to the columnar structure 105 in the juxtaposition direction is constructed as the second expansion restraining structure 116 on the same silicon substrate 101 as the columnar structure 105. However, as shown in the eighth embodiment, application of the external force from the outside of the silicon substrate 101 to the pressing structure 103 may restrain the expansion of the pressing structure 103 toward the side opposite to the columnar structure 105 in the juxtaposition direction in the third step. This also makes it possible to improve the pressing force by the pressing structure 103 in the third step.

The above-mentioned seventh to tenth embodiments show the examples in which the microlens 102 is formed as the optically-transparent silicon oxide block. The above-mentioned manufacturing methods, however, can be applied to any element having an optical function. Also, any silicon oxide block formed using the above-mentioned manufacturing methods have the same effect as that of the microlens 102 shown in this embodiment. For example, a prism or an optical waveguide in addition to the microlens 102 can be formed. A plurality of silicon oxide blocks having the same optical function may be disposed on the same silicon substrate 101 as one optical device 100. Alternatively, silicon oxide blocks having the different optical functions may be disposed on the same silicon substrate 101 as one optical device 100. The microlens 102 is not limited to a piano-convex cylindrical lens.

In the tenth embodiment, the example of the pressing structure 103 includes the plurality of pressing portions 103a with a semicircular or circular plane connected by the thin portions 103b, each of which is thinner than the pressing portion 103a, along the extending direction of the columnar structures 105. The embodiment of the pressing structure 103 is not limited to the above-mentioned example. At the time of the completion of the second step, the voids derived from the first trenches 110 exist between the adjacent columnar structures 105 in the juxtaposition direction. Any embodiment in which the pressing structure 103 is oxidized in the third step and the expansion thereof presses the columnar structure 105 in the juxtaposition direction can be adopted.

Figure 36A:
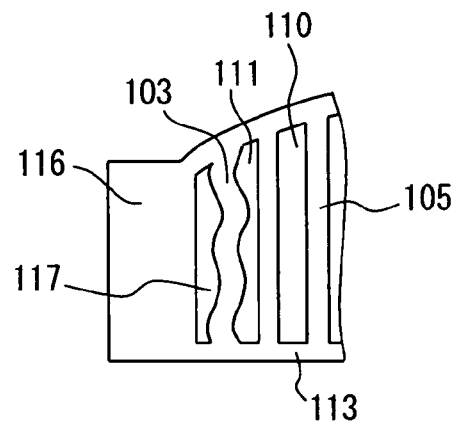
FIGS. 36A to 36C are schematic plan views showing optical devices in part according to modifications of the present invention.
Figure 36B:
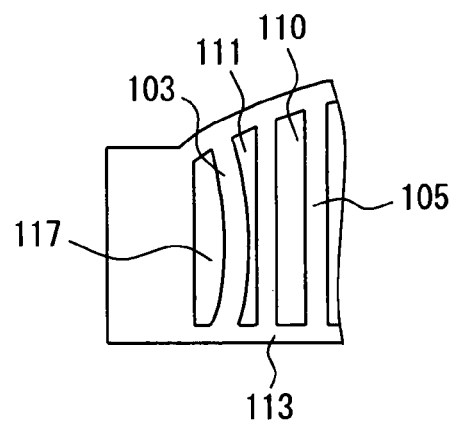
Figure 36C:
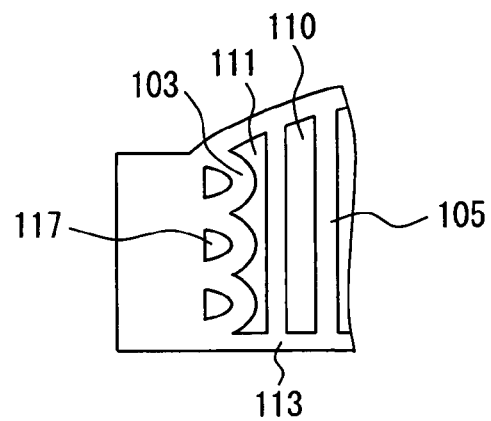

A pressing structure 103 having a waved plane (or an S-like plane) shown in FIG. 36A, a pressing structure 103 having an arc shaped plane shown in FIG. 36B, and a pressing structure 103 including a series of a plurality of portions with an arc-shaped plane shown in FIG. 36C can be adopted. The widths of the pressing structures 103 shown in FIGS. 36A to 36C can be set appropriately to press the columnar structures 105 in the third step. For example, in the structure shown in FIG. 36B, when an unoxidized area exists in a connection portion (T-like portion) with at least the outline structure 113 at the time of the completion of the second step, the columnar structures 105 can be pressed by the oxidation of the unoxidized area in the third step. FIGS. 36A to 36C are plan views showing the modified examples, each of which illustrates the state at the time of the completion of the first step. The first trench 110, the second trench 111, and the third trench 117 are shown in the respective drawings. FIGS. 36A to 36C show the examples in which the pressing structure 103 is connected with the columnar structure 105 and the second expansion restraining structure 116 by the outline structure 113. However, the structure without the second expansion restraining structure 116 may be adopted, or the pressing structure 103 may not be connected to at least one of the columnar structure 105 and the second expansion restraining structure 116. Alternatively, the structure without the outline structure 113 may be adopted.

Figure 37A:
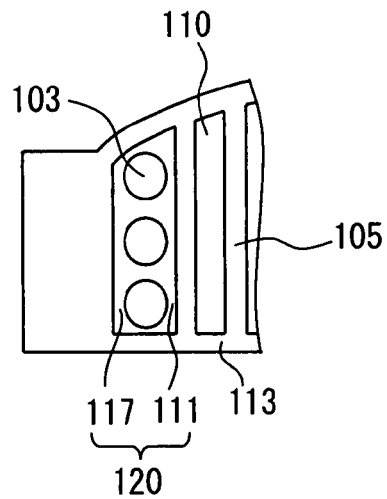
FIGS. 37A and 37B are schematic plan views showing optical devices in part according to modifications of the present invention.
Figure 37B:
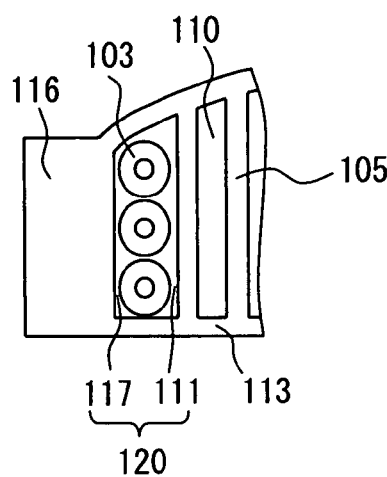

The pressing structure 103 may be independently structured, for example, at the time of the completion of the first step. For example, a pressing structure 103 having a circular plane shown in FIG. 37A or/and an annular pressing structure 103 shown in FIG. 37B can be adopted as the pressing structure 103 having the independent structure. FIGS. 37A and 37B are plan views showing the modified examples, each of which illustrates the state at the time of the completion of the first step. In FIGS. 37A and 37B, a plurality of (three) pressing structures 103 are disposed and spaced apart from each other within the trench 120, which is enclosed by the columnar structure 105 at the end in the juxtaposition direction, the outline structure 113, and the second expansion restraining structure 116. And, a part serving as a second trench 111 and a part serving as a third trench 117 are contained in the trench 120. FIGS. 37A and 37B show examples in which the columnar structures 105 are connected to the second expansion restraining structure 116 by the outline structure 113. However, the columnar structure 105 may not be connected to the second expansion restraining structure 116. Alternately, the structure without the outline structure 113 may be employed. Furthermore, the structure without the second expansion restraining structure 116 may be employed.

Figure 38:
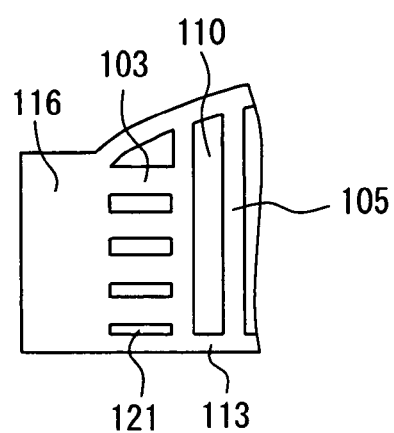
FIG. 38 is a schematic plan view showing a part of an optical device according to a modification of the present invention.

As shown in FIG. 38, the pressing structure 103 may be connected to the columnar structure 105 at the time of the completion of the first step. In FIG. 38, a plurality of (e.g., four) pressing structures 103 are provided to extend perpendicularly to the extending direction of the columnar structure 105 within an area constructed by the columnar structure 105, the second expansion restraining structure 116, and the outline structure 113. And, the pressing structures 103 are connected not only to the columnar structure 105, but also to the second expansion restraining structure 116. The pressing structures 103 divide the trench 121 into a plurality of (five) sections within the area constructed by the columnar structure 105, the second expansion restraining structure 116, and the outline structure 113. With this arrangement, the appropriate setting of the pressing structures 103 and the trench 121 causes voids derived from the first trench 110 between the adjacent structures 105 in the juxtaposition direction at the time of the completion of the second step. Thus, the pressing structures 103 are oxidized in the third step (that is, the voids derived from the trench 121 exist at the time of the completion of the second step), whereby the expansion of the pressing structures can press the columnar structures 105 in the juxtaposition direction. FIG. 38 is a plan view showing the modified example, which illustrates the state at the time of the completion of the first step. FIG. 38 shows the example in which the columnar structure 105 is connected to the second expansion restraining structure 116 by the outline structure 113. However, the structure in which the columnar structure 105 is not connected to the second expansion restraining structure 116 may be employed, or the structure without the outline structure 113 may be employed. Alternatively, the structure without the second expansion restraining structure 116 may be employed.

Figure 39A:
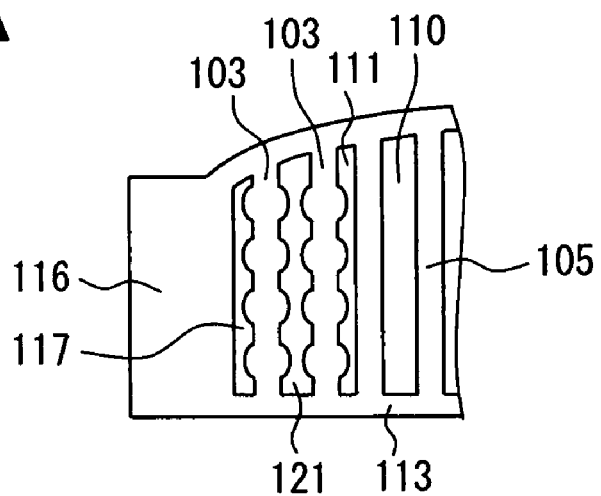
FIGS. 39A and 39B are schematic plan views each showing a part of an optical device in a trench etching step and a pressing step according to a modification of the present invention.
Figure 39B:
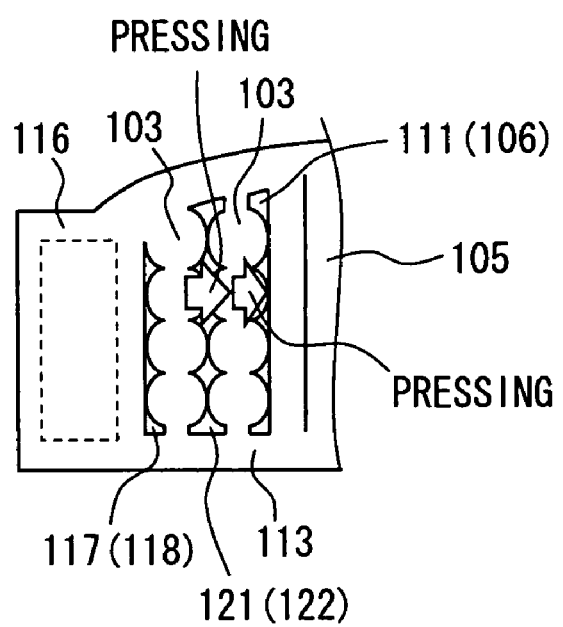
Figure 40A:
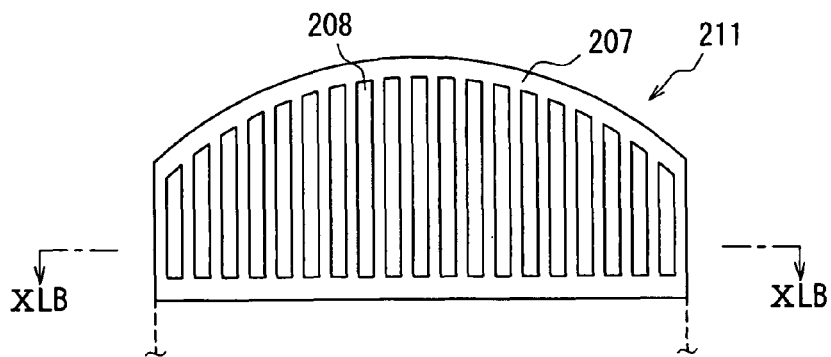
FIG. 40A is a plan view showing a lens after etching is performed in a related art.
Figure 40B:
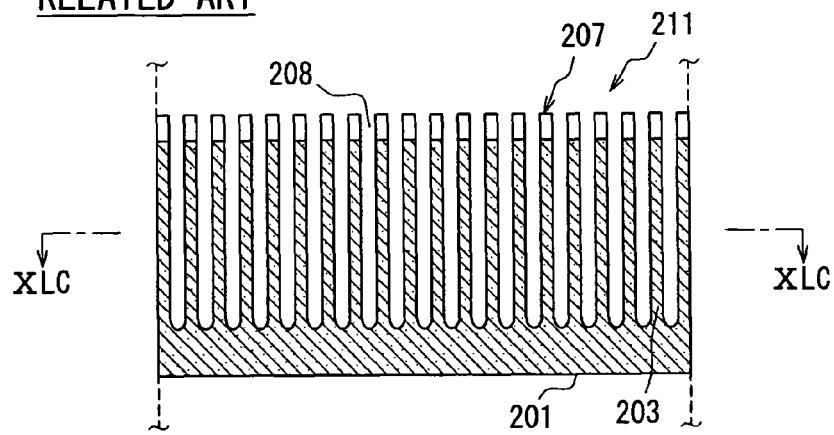
FIG. 40B is a cross-sectional view taken along the line XLB-XLB in FIG. 40A.
Figure 40C:
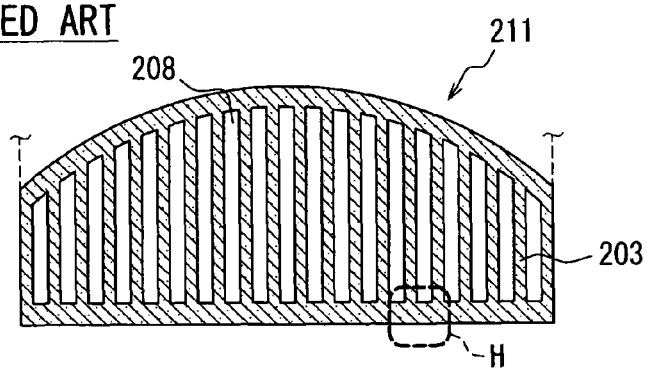
FIG. 40C is a cross-sectional view taken along the line XLC-XLC in FIG. 40B.
Figure 41A:
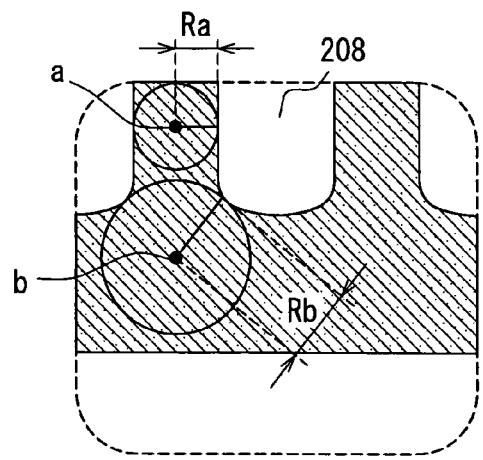
FIGS. 41A to 41C are enlarged diagrams showing the part indicated by H in FIG. 40C, at a start state of oxidization, at a state where a columnar structure is completely oxidized, and at a state where oxidization of an unoxidized residue is ended.
Figure 41B:
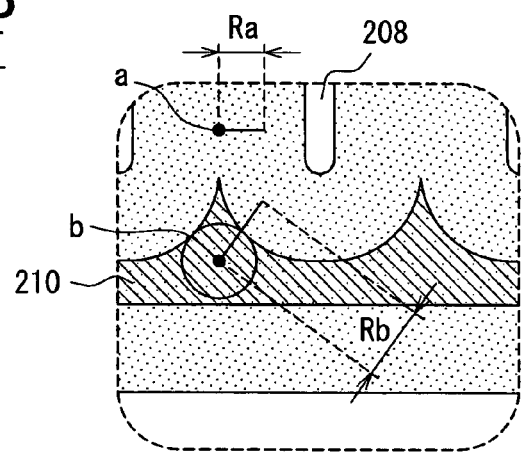
Figure 41C:
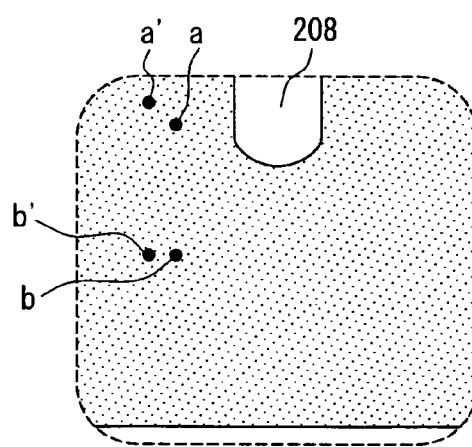

This embodiment shows the example in which one pressing structure 103 is provided at one end of the plurality of columnar structures 105 in the juxtaposition direction. However, the plurality of pressing structures 103 may be provided in succession in the juxtaposition direction at one end of the columnar structures 105. As one example, as shown in FIG. 39A, the pressing structures 103 are arranged in two lines in the structure shown in the tenth embodiment. As shown in FIG. 39B, the pressing force (stroke amount) is improved by the effect of the plurality of pressing structures 103 disposed in the juxtaposition direction in the third step. FIGS. 39A and 39B show the modified example, in which FIG. 39A is a plan view showing the first step (trench etching step), and FIG. 39B is a plan view showing the third step (pressing step). With the arrangement shown in FIGS. 39A and 39B, the appropriate setting of the pressing structures 103 and the trenches 111, 117, 121 (in which the trench 121 is a trench located between the pressing structures 103) causes voids derived from the first trench 110 between the adjacent columnar structures 105 in the juxtaposition direction at the time of the completion of the second step (thermal oxidation step). Thus, the pressing structures 103 are oxidized in the third step, whereby the expansion of the pressing structures can press the columnar structures 105 in the juxtaposition direction. Specifically, the expansion of the pressing structure 103 on the outside in the juxtaposition direction (on the second expansion restricting structure 116 side) outward (toward the opposite side of the columnar structures 105) of the pressing structure 103 is restrained by the second expansion restraining structure 116, thereby improving the pressing force to the columnar structure 105 side. A part of this pressing force restrains the expansion of the pressing structure 103 on the inner side in the juxtaposition direction (on the columnar structure 105 side) outward (toward the opposite side of the columnar structure 105), which improves the pressing force to the columnar structure 105 side. That is, a part of the pressing force of the pressing structure 103 on the outside in the juxtaposition direction is superimposed on the pressing force of the pressing structure 103 on the inner side in the juxtaposition direction to create the pressing force of the columnar structures 105. This allows the adjacent columnar structures 105 to be efficiently brought into press-contact with each other. FIGS. 39A and 39B show examples in which the pressing structures 103 are connected with the columnar structures 105 and the second expansion restraining structure 116 by the outline structure 113. However, the structure without the second expansion restraining structure 116 may be employed, or the structure in which the pressing structures 103 are not connected to at least one of the columnar structures 105 and the second expansion restraining structure 116 may be employed. Alternatively, the structure without the outline structure 113 may be employed.

This embodiment shows the example in which the pressing structures 103 are thermally oxidized together with the columnar structure 105 in the second step. However, alternatively, the columnar structures 105 may be selectively and thermally oxidized without the thermal oxidation of the pressing structures 103 in the second step, and then the pressing structures 103 may be thermally oxidized in the third step, thereby pressing the columnar structures 105. This can improve flexibility in design of the pressing structure 103.

This embodiment shows the example in which the deformation of the pressing structure 103 and the columnar structure 105 can be restrained by the first expansion restraining structure 115 and the second expansion restraining structure 116. However, a side wall of the concave 104 of the silicon substrate 101 can be applied as an expansion restraining portion.

In the example of this embodiment, the first expansion restraining structure 115 and the second expansion restraining structure 116 are formed using the same material (silicon) as that of the pressing structure 103 and the columnar structure 105. However, the first expansion restraining structure 115 and the second expansion restraining structure 116 can be formed using different material from that of the pressing structure 103 and the columnar structure 105 as long as the material has high rigidity and can restrain the deformation of the pressing structure 103 and the columnar structure 105. For example, a metal member is fixed to the side wall of the concave 104 of the silicon substrate 101, which can constitute the first expansion restraining structure 115 or the second expansion restraining structure 116.

Although in the embodiment the mask 109 used in etching is an oxide mask, the mask 109 used is not limited thereto. For example, the invention can be implemented using a resist mask, instead of the oxide mask.

Although the present invention has been fully described in connection with the preferred embodiments thereof with reference to the accompanying drawings, it is to be noted that various changes and modifications will become apparent to those skilled in the art. Such changes and modifications are to be understood as being within the scope of the present invention as defined by the appended claims.

What is claimed is:

1. A method of manufacturing an optical device that is made of silicon oxide and through which light is capable of passing, the method comprising:
    a first step of forming, on a substrate surface of a silicon substrate, an optical-device forming body that includes a plurality of columnar structures arranged in an arrangement direction on the substrate surface via a trench provided therebetween and an outline structure connected to and containing therein the plurality of columnar structures;
    a second step of oxidizing the optical-device forming body from a state where the optical-device forming body starts to be oxidized to a state where the columnar structure is oxidized; and
    a third step in which an unoxidized residual part of the outline structure in the second step is oxidized after the second step, so as to form an oxide block,
    wherein the third step includes restraining the outline structure from being deformed with respect to at least the arrangement direction of the columnar structures in the third step, the restraining being performed by a stopper.

2. The method according to claim 1, wherein the stopper is a part of the silicon substrate integrally formed on a side end surface in the arrangement direction of the columnar structures of the optical-device forming body.

3. The method according to claim 2, wherein the stopper is brought into contact with a surface of the oxidized part other than an incident surface and an emission surface of an incident light of the oxide block.

4. The method according to claim 2, wherein the stopper has a convex shape or a concave shape with respect to a direction perpendicular to the arrangement direction of the columnar structures.

5. The method according to claim 2, wherein the stopper restrains the deformation of the outline structure with respect to the arrangement direction of the columnar structures due to the oxidation of the unoxidized residual part of the outline structure in the third step.

6. The method according to claim 1, wherein the light enters from an end surface of the oxide block, on a side perpendicular to the arrangement direction.

7. The method according to claim 1, wherein the trench remains at a time of completion of the second step.

8. The method according to claim 2, wherein silicon oxide which is restrained from expanding in the arrangement direction of the columnar structures by the stopper flows into the trench in the third step.

9. The method according to claim 1, wherein the trench is not filled completely to cause a void to remain at the time of the completion of the third step, the method further comprising
    filling the void by a coating process of a silicon oxide film.

10. The method according to claim 1, wherein an end surface of the oxide block on a side of the silicon substrate has a continuous concavo-convex shape in an extending direction of the silicon substrate.

11. The method according to claim 1, wherein an end surface of the oxide block on a side of the silicon substrate has a continuous concavo-convex shape in a direction perpendicular to an optical axis.

12. The method according to claim 1, wherein the plurality of columnar structures are provided to extend in parallel to an optical axis on an upper surface of the silicon substrate.

13. The method according to claim 1, wherein an end surface of the oxide block is connected to a connection portion of the silicon substrate, which has a shape corresponding to the oxide block.

14. The method according to claim 1, wherein the oxide block is formed in a concave portion formed in the silicon substrate, and end surfaces of the oxide block on a light incident side and a light emission side into and from the oxide block are spaced apart from a wall surface of the concave portion of the silicon substrate.

15. The method according to claim 14, wherein an end surface of the oxide block other than the end surfaces of the oxide block on the light incident side and the light emission side into and from the optical device is in contact with the wall surface of the convex portion, so that the deformation of the outline structure is restrained by the wall surface.

16. The method according to claim 1, wherein the oxide block has a thickness of 10 μm or more in a direction perpendicular to the arrangement direction and an extending direction of the columnar structure when the third step is complicated.

17. The method according to claim 1, wherein the oxide block has impurities added thereto so as to have a concentration distribution in a direction perpendicular to the arrangement direction and an extending direction of the columnar structure.

18. The method according to claim 17, wherein the impurity includes at least one of germanium (Ge), phosphorus (P), stannum (Sn), and boron (B).

19. The method according to claim 1, wherein a plurality of the oxide blocks including at least one of a lens, an optical waveguide, and a slit are formed in the silicon substrate.

20. The method according to claim 1, wherein a width of the trench and a width of the columnar structure in the first step are set such that the trench is filled with the silicon oxide while the outline structure becomes the silicon oxide in a thermal oxidation of the third step.

21. The method according to claim 1, wherein the trenches arranged side by side in the first step extend in parallel with the optical axis.

22. The method according to claim 1, wherein the first step comprises forming the trench by reactive ion etching, forming an oxide film for protection on an inner wall of the trench, etching the oxide film for protection on a bottom of the trench, and then further deepening the trench from the bottom by the reactive ion etching, thereby to form the trench having an aspect ratio of one or more.

23. The method according to claim 1, wherein forming the trench in the silicon substrate, in which an impurity concentration is changed in a predetermined direction perpendicular to the arrangement direction and an extending direction of the columnar structure, causes impurities contained in the oxide block to have the concentration distribution in the predetermined direction of the oxide block.

24. The method according to claim 1, wherein the oxidation in the third step is performed at a temperature that is capable of annealing the silicon oxide, and allows the columnar structures opposed with the trench sandwiched therebetween to be connected to each other by fusion.

25. A method of manufacturing an optical device, comprising:
a first step of performing trench etching in a silicon substrate using a patterned mask and forming a plurality of columnar structures such that the columnar structures are arranged in an arrangement direction via a first trench;
a second step of replacing the entire columnar structures with silicon oxide by thermal oxidation; and
a third step of pressing the plurality of columnar structures in the arrangement direction after the second step under a condition in which the silicon oxides are fusion bonded,
wherein the first trench and the columnar structures are formed in the first step such that a void derived from the first trench remains between the adjacent columnar structures at a time of completion of the second step, and
wherein in the third step, the adjacent columnar structures are brought into contact with each other by being pressed in the arrangement direction, and the plurality of columnar structures are connected by fusion and integrated to form a silicon oxide block through which light passes.

26. The method according to claim 25,
wherein in the first step, a columnar pressing structure is formed outside at least one of two ends in the arrangement direction of the plurality of columnar structures by the trench etching,
wherein the pressing structure has an unoxidized residual area at the time of the completion of the second step, and
wherein in the third step, the plurality of columnar structures are pressed by the pressing structure by oxidizing at least a part of the unoxidized area to form the silicon oxide block in a thermal oxidation condition set as a condition of fusion of the silicon oxide.

27. The method according to claim 26, wherein the pressing structure is formed via a second trench with respect to the end of the columnar structure in the first step.

28. The method according to claim 25,
wherein in the second step, the columnar structures are selectively and thermally oxidized without thermally oxidizing the pressing structure, and
wherein in the third step, the pressing structure is thermally oxidized.

29. The method according to claim 27,
wherein the pressing structure has an area which is replaced with the silicon oxide and the unoxidized area at the time of the completion of the second step, and
wherein the second trench and the pressing structure are formed in the first step such that a void derived from the second trench remains.

30. The method according to claim 27, wherein the second trench and the pressing structure are formed in the first step such that the void derived from the second trench remains at the time of the completion of the third step.

31. The method according to claim 30, wherein the second trench and the pressing structure are formed in the first step such that the plurality of voids remain and are distributed at the time of the completion of the third step.

32. The method according to claim 26, wherein the pressing structure is formed in the first step to be connected with the columnar structure.

33. The method according to claim 26, wherein the pressing structure is formed in the first step to be independent from the columnar structures.

34. The method according to claim 26, wherein the plurality of pressing structures are formed in the arrangement direction with respect to at least one end of the plurality of the columnar structures in the first step.

35. The method according to claim 26, wherein the pressing structures are respectively formed with respect to the two ends of the plurality of columnar structures in the arrangement direction.

36. The method according to claim 26,
wherein the pressing structure is formed with respect to one end of the plurality of columnar structures in the arrangement direction, and a first expansion restraining structure is formed by the trench etching so as to be adjacent to the other end of the plurality of columnar structures in the arrangement direction, and
wherein the first expansion restraining structure has a silicon width in the arrangement direction that is wider than that of the columnar structure and that of the pressing structure, and is adapted for restraining deformation of the columnar structure toward an opposite side to the pressing structure in the arrangement direction.

37. The method according to claim 26, wherein deformation of the pressing structure toward an opposite side to the columnar structure in the arrangement direction is restrained in the third step.

38. The method according to claim 37,
wherein a second expansion restraining structure is formed by the trench etching in the first step so as to sandwich the pressing structure between the second expansion restraining structure and the end of the plurality of columnar structures in the arrangement direction, and
wherein the second expansion restraining structure has a silicon width in the arrangement direction that is wider than that of the pressing structure, and is adapted for restraining deformation of the pressing structure toward an opposite side to the columnar structure in the arrangement direction.

39. The method according to claim 25, wherein a substrate doped with impurities in high concentration is used as the silicon substrate.

40. The method according to claim 25, wherein the first trench is provided to extend in parallel to the optical axis of the silicon oxide block in the first step.

41. The method according to claim 40, wherein an outer peripheral trench is formed around forming areas of the columnar structures in the first step such that an outermost peripheral portion in the silicon oxide block for defining shapes of a light incident surface and a light emission surface is connected with an outline structure having a predetermined width, and that the entire outline structure is replaced with silicon oxide at the time of the completion of the second step.

42. The method according to claim 25, wherein the trench etching comprises forming the trench by reactive ion etching, forming an oxide film for protection on an inner wall of the trench, etching the oxide film for protection on a bottom of the trench, and then further deepening the trench from the bottom of the trench by the reactive ion etching, thereby to form the trench having an aspect ratio of one or more at least as the first trench.

* * * * *